US011838127B2

(12) United States Patent
Lee et al.

(10) Patent No.: US 11,838,127 B2
(45) Date of Patent: Dec. 5, 2023

(54) ADAPTIVE SATELLITE COMMUNICATIONS

(71) Applicant: Hughes Network Systems, LLC, Germantown, MD (US)

(72) Inventors: Lin-nan Lee, Potomac, MD (US); Mustafa Eroz, Rockville, MD (US); Rohit Iyer Seshadri, Gaithersburg, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 0 days.

(21) Appl. No.: 17/693,188

(22) Filed: Mar. 11, 2022

(65) Prior Publication Data
US 2023/0291499 A1    Sep. 14, 2023

(51) Int. Cl.
*H04L 1/00* (2006.01)
*H03M 13/11* (2006.01)
(Continued)

(52) U.S. Cl.
CPC ....... *H04L 1/0061* (2013.01); *H03M 13/1148* (2013.01); *H03M 13/255* (2013.01); *H04B 7/18506* (2013.01)

(58) Field of Classification Search
CPC ... H04L 1/0061; H04L 1/0058; H04L 1/0057; H03M 13/1148; H03M 13/255
See application file for complete search history.

(56) References Cited

U.S. PATENT DOCUMENTS

| 5,835,165 A | 11/1998 | Keate et al. |
| 5,912,902 A | 6/1999 | Monroe |

(Continued)

FOREIGN PATENT DOCUMENTS

| EP | 0794631 | 9/1997 |
| EP | 1710941 | 10/2006 |

(Continued)

OTHER PUBLICATIONS

International Preliminary Report on Patentability in International Appln. No. PCT/US2020/060699, dated Jun. 9, 2022, 10 pages.

(Continued)

*Primary Examiner* — Esaw T Abraham
(74) *Attorney, Agent, or Firm* — Fish & Richardson P.C.

(57) ABSTRACT

Methods, systems, and apparatus, including computer programs encoded on computer storage media, for improving adaptive satellite communication. In some implementations, a method includes receiving, by a receiver and from a transmitter, code blocks transmitted according to a first set of parameters that comprises one or more of a first modulation used to transmit the code blocks or a first coding used to encode the code blocks for transmission. A number of corrupted code blocks and a number of parity blocks in a series of the code blocks received are determined. The number of corrupted code blocks are compared with the number of parity blocks. A second set of parameters are determined based on the comparison of the number of corrupted code blocks with the number of parity blocks. The second set of parameters are communicated to the transmitter for subsequent transmissions.

20 Claims, 8 Drawing Sheets

(51) Int. Cl.
*H03M 13/25* (2006.01)
*H04B 7/185* (2006.01)

(56) References Cited

U.S. PATENT DOCUMENTS

| | | | |
|---|---|---|---|
| 6,055,277 A | 4/2000 | Stephens et al. | |
| 6,763,025 B2 | 7/2004 | Leatherbury et al. | |
| 6,829,308 B2 | 12/2004 | Eroz et al. | |
| 7,142,521 B2 | 11/2006 | Haugli et al. | |
| 7,161,988 B2 | 1/2007 | Lee et al. | |
| 7,197,690 B2 | 3/2007 | Shen et al. | |
| 7,281,192 B2 | 10/2007 | Shen et al. | |
| 7,296,208 B2 | 11/2007 | Sun et al. | |
| 7,322,005 B2 | 1/2008 | Shen et al. | |
| 7,383,493 B2 | 6/2008 | Shen et al. | |
| 7,436,902 B2 | 10/2008 | Shen et al. | |
| 7,502,985 B2* | 3/2009 | Gendrier | H03M 13/09 714/763 |
| 7,551,740 B2* | 6/2009 | Lee | H04N 19/625 380/278 |
| 7,581,162 B2 | 8/2009 | Eroz et al. | |
| 7,590,083 B2 | 9/2009 | Haugli et al. | |
| 7,721,184 B2 | 5/2010 | Luby et al. | |
| 7,770,089 B2 | 8/2010 | Eroz et al. | |
| 7,907,641 B2 | 3/2011 | Sun et al. | |
| 7,954,036 B2 | 5/2011 | Eroz et al. | |
| 7,995,578 B2 | 8/2011 | Kim et al. | |
| 8,028,224 B2 | 9/2011 | Eroz et al. | |
| 8,069,393 B2 | 11/2011 | Eroz et al. | |
| 8,102,947 B2 | 1/2012 | Eroz et al. | |
| 8,140,931 B2 | 3/2012 | Eroz et al. | |
| 8,140,946 B2 | 3/2012 | Eroz et al. | |
| 8,144,801 B2 | 3/2012 | Eroz et al. | |
| 8,145,980 B2 | 3/2012 | Eroz et al. | |
| 8,170,502 B2 | 5/2012 | Seshardi et al. | |
| 8,181,085 B2 | 5/2012 | Eroz et al. | |
| 8,238,284 B2 | 8/2012 | Wilcoxson et al. | |
| 8,254,303 B2 | 8/2012 | Becker et al. | |
| 8,275,081 B2 | 9/2012 | Jiang et al. | |
| 8,320,296 B2 | 11/2012 | Becker et al. | |
| 8,326,213 B2 | 12/2012 | Sun et al. | |
| 8,369,448 B2 | 2/2013 | Zhang et al. | |
| 8,392,793 B2 | 3/2013 | Eroz et al. | |
| 8,402,341 B2 | 3/2013 | Eroz et al. | |
| 8,483,308 B2 | 7/2013 | Eroz et al. | |
| 8,527,833 B2 | 9/2013 | Seshardi et al. | |
| 8,571,480 B2 | 10/2013 | Lee et al. | |
| 8,615,699 B2 | 12/2013 | Eroz et al. | |
| 8,619,974 B2 | 12/2013 | Fang et al. | |
| 8,683,288 B2 | 3/2014 | Shen et al. | |
| 8,683,292 B2 | 3/2014 | Lee et al. | |
| 8,782,489 B2 | 7/2014 | Eroz et al. | |
| 8,792,322 B2 | 7/2014 | Stadelmeier et al. | |
| 8,887,024 B2 | 11/2014 | Eroz et al. | |
| 8,891,434 B2 | 11/2014 | Wesley et al. | |
| 8,964,896 B2 | 2/2015 | Lee et al. | |
| 8,976,727 B2 | 3/2015 | Wilcoxson et al. | |
| 9,009,559 B2 | 4/2015 | Lee et al. | |
| 9,054,849 B2* | 6/2015 | Myung | H04L 27/0012 |
| 9,118,353 B2 | 8/2015 | Eroz et al. | |
| 9,130,814 B2 | 9/2015 | Petrov et al. | |
| 9,143,277 B2 | 9/2015 | Becker et al. | |
| 9,203,431 B2 | 12/2015 | Lee et al. | |
| 9,203,492 B2 | 12/2015 | Eroz et al. | |
| 9,246,634 B2 | 1/2016 | Eroz et al. | |
| 9,264,675 B2 | 2/2016 | Antia et al. | |
| 9,294,131 B2 | 3/2016 | Eroz et al. | |
| 9,306,791 B2 | 4/2016 | Delaruelle | |
| 9,319,172 B2 | 4/2016 | Jalali et al. | |
| 9,397,704 B2 | 6/2016 | Eroz et al. | |
| 9,391,642 B2 | 7/2016 | Eroz et al. | |
| 9,515,723 B2 | 12/2016 | Beidas et al. | |
| 9,572,166 B2 | 2/2017 | Pandey | |
| 9,614,554 B2 | 4/2017 | Beidas et al. | |
| 9,628,867 B2 | 4/2017 | Qin et al. | |
| 9,634,870 B2 | 4/2017 | Beidas et al. | |
| 9,819,530 B2 | 11/2017 | Yaman et al. | |
| 9,941,952 B2 | 4/2018 | Antia et al. | |
| 10,020,965 B2 | 7/2018 | Beidas et al. | |
| 10,104,631 B2 | 10/2018 | Lee et al. | |
| 10,168,938 B2 | 1/2019 | Chen et al. | |
| 10,237,016 B2 | 3/2019 | Beidas et al. | |
| 10,263,814 B2 | 4/2019 | Eroz et al. | |
| 10,277,434 B2 | 4/2019 | Chung et al. | |
| 10,348,449 B2 | 7/2019 | Rainish et al. | |
| 10,484,084 B2 | 11/2019 | Lee et al. | |
| 10,530,394 B2 | 1/2020 | Eroz et al. | |
| 10,541,780 B2* | 1/2020 | Mukkavilli | H04L 1/0045 |
| 10,608,790 B2* | 3/2020 | Nammi | H04L 1/08 |
| 10,615,913 B2* | 4/2020 | Oveis Gharan | H04L 1/0041 |
| 10,630,512 B2 | 4/2020 | Eroz et al. | |
| 10,680,712 B2 | 6/2020 | Boroson et al. | |
| 10,727,980 B2 | 7/2020 | Peyla et al. | |
| 10,763,993 B2 | 9/2020 | Eroz et al. | |
| 10,879,928 B2* | 12/2020 | Ahirwar | H04L 25/0224 |
| 11,012,095 B2 | 5/2021 | Eberlein et al. | |
| 11,025,456 B2 | 6/2021 | Chatterjee et al. | |
| 11,223,372 B2 | 1/2022 | Liau | |
| 11,405,057 B2* | 8/2022 | Jia | H04L 1/1819 |
| 11,601,140 B2 | 3/2023 | Liau | |
| 2004/0252725 A1 | 12/2004 | Sun et al. | |
| 2008/0082895 A1 | 4/2008 | Eroz et al. | |
| 2011/0258669 A1 | 10/2011 | Antia et al. | |
| 2013/0154755 A1 | 6/2013 | Eroz et al. | |
| 2019/0013892 A1 | 1/2019 | Chen et al. | |
| 2019/0123849 A1* | 4/2019 | Baldemair | H04L 1/0009 |
| 2020/0280827 A1 | 9/2020 | Fechtel et al. | |
| 2021/0044371 A1 | 2/2021 | Chen et al. | |
| 2021/0159919 A1 | 5/2021 | Liau | |
| 2022/0182077 A1 | 6/2022 | Liau | |

FOREIGN PATENT DOCUMENTS

| | | |
|---|---|---|
| EP | 2639155 | 9/2013 |
| WO | WO 2016/168253 | 10/2016 |
| WO | WO 2016/187170 | 11/2016 |

OTHER PUBLICATIONS

Benedetto et al., "MHOMS: high-speed ACM modem for satellite applications," IEEE Wireless Communications, May 2005, 12(2):66-77.

International Search Report and Written Opinion in International Appln. No. PCT/US2020/060699, dated Mar. 3, 2021, 16 pages.

staticl.squarespace.com [online], "Developments in Advanced SATCOM Networking from Hughes," Nov. 10, 2015, retrieved on Feb. 11, 2020, retrieved from URL<https://staticl.squarespace.com/static/5274112ae4b02d3f058d4348/t/564e761ce4b0b03843732515/1447982620364/2015-2-6b.pdf>, 61 pages.

Wikipedia [online], "Gray code," last edited Jan. 29, 2022, retrieved on Feb. 7, 2022, retrieved from URL <https://en.wikipedia.org/wiki/Gray_code>, 25 pages.

Wikipedia [online], "Modulation," last edited Dec. 17, 2021, retrieved on Feb. 7, 2022, retrieved from URL <https://en.wikipedia.org/wiki/Modulation>, 9 pages.

Zhang et al., "Multi-ring PSK Constellation Design for Spatial Modulation Transmission," Proceedings of the International Conference on Computer Information Systems and Industrial Applications, Jun. 2015, 4 pages.

Zhang et al., "Novel APM constellation design for spatial modulation systems," International Conference on Wireless Communications & Signal Processing (WCSP), Dec. 3, 2015, 5 pages.

Etsi.org, Digital video broadcasting (DVB); Second generation framing structure, channel coding and modulation systems for broadcasting, interactive services, news gathering and other broadband satellite applications; Part 2: DVB-S2 Extensions (DVB-S2X), Jul. 28, 2021, 166 pages.

International Search Report and Written Opinion in International Appln. No. PCT/US2023/064132, dated Jun. 7, 2023, 15 pages.

(56) References Cited

OTHER PUBLICATIONS

Jia et al., "Joint occlusion detection and phase estimation algorithm for helicopter satellite communication," IEEE Transactions on aerospace and electronic systems, Jun. 3, 2019, pp. 687-697.
Wang et al., "Design of check-hybrid LDPC codes for data communications over helicopter-satellite channels," IEEE, Sep. 24, 2017, Sep. 24, 2017, 5 pages.

* cited by examiner

Table of Modulation based on Signal to Noise (S/N) ratio

| Modulation | QPSK | 8-PSK | 8+8 APSK | 8+8+16 APSK |
|---|---|---|---|---|
| S/N (dB) | 5 | 5-9 | 9-10 | >10 |
| S/N with Margin (dB) | 8 | 5-12 | 12-13 | >13 |

FIG. 4

500

Receiving, by a receiver and from a transmitter, code blocks transmitted on a communication channel according to a first set of communication parameters that comprises one or more of a first modulation used to transmit the code blocks or a first coding used to encode information in the code blocks prior to transmission
502

Determining a number of corrupted code blocks in a series of the code blocks received by the receiver
504

Determining a number of parity blocks in the series of code blocks
506

Comparing the number of corrupted code blocks in the series of code blocks with the number of parity blocks in the series of code blocks
508

Determining a second set of communication parameters for communication between the transmitter and the receiver based on the comparison of the number of corrupted code blocks in the series of code blocks with the number of parity blocks in the series of code blocks
510

Communicating the second set of communication parameters to the transmitter for subsequent transmissions by the transmitter to the receiver
512

FIG. 5

ADAPTIVE SATELLITE COMMUNICATIONS

TECHNICAL FIELD

This present specification relates to improving and adapting satellite communications despite periodic blockages.

BACKGROUND

Communications between a transmitter and a receiver can be subjected to recurring or sporadic blockages. For example, a spinning rotor can periodically block communications between a satellite terminal of a helicopter and a satellite. The communications that are blocked by the rotor may be corrupted or partially corrupted, requiring either error correction or retransmission, which can take time and require unnecessary use of bandwidth or processing power.

SUMMARY

In some implementations, a communication system can enhance communications over a communication link when a periodic blockage exists in that communication link. The communication system can be a satellite communication system. The communication system can analyze characteristics of the periodic blockage to determine a frame structure that includes an appropriate number and arrangement of blocks of parity data interleaved in the transmission, in order to be able to recover data from blockages. In addition, the system can adaptively change the modulation and/or coding used over time to improve communications over the communication link, e.g., to improve throughput, error correction capabilities, bandwidth utilization, or other communication properties. In particular, the system enables a receiving terminal to detect when reception has the capability to handle a greater number of errors or erasures due to the periodic blockage. When the condition is detected and persists for a sufficient amount of frames or amount of time, the terminal can request to change communication parameters to improve throughput, thus causing the system to operate closer to the highest data throughput that that the channel supports.

In some implementations, the communication system can improve throughput of communications over the communication link with a helicopter. A ground station or gateway may communicate with the helicopter through a satellite in the satellite communication system. During flight, the helicopter can transmit to the ground station and receive communications from the ground station through the satellite. However, as the rotor of the helicopter rotates, the blades of the rotor pass through the line of communication with the satellite, causing periodic blockages or interruptions of the communication link. Typically, the rotor rotates at consistent speed, and as a result the disruption to the communication link occurs with a substantially consistent frequency. Nevertheless, the characteristics of the periodic blockage can change based on various factors associated with the helicopter, e.g., speed, angle of tilt, rotating speed of the helicopter blade, and direction of travel, to name a few examples, and factors associated with the satellite, e.g., position of the satellite, velocity of the satellite, and position of the satellite with respect to the ground station and the moving helicopter.

The communication system can use various protocols to carry out the communications over the communication link between the ground station and the helicopter despite of the periodic blockage. For example, an upper-layer protocol, such as Upper Layer Protocol Enhancement (ULPE), can aid in the protection of helicopter periodic blockages.

Satellite systems are typically designed with a link margin, which is a difference between the minimum expected power received at the receiver's end, and the receiver's sensitivity, e.g., the received power at which the receiver stops working. The link margin is often measured in terms of signal-to-noise ratio (SNR) or signal-to-interference-and-noise ratio (SINR), which are often expressed in units of decibels (dB). While it is prudent to maintain a link margin for reliability, the high effectiveness of forward error correction coding such as low-density parity check (LDPC) coding, and other techniques in recovering errors can allow reliable operation with lower link margins. For example, the system may be configured to operate with a relatively low link margin to boost throughput. The communication system can set target parameters that provide or represent a low link margin, and then exploit any excess link margin to increase throughput in the presence of the periodic blockage from the helicopter blades, to improve communications between the ground station and the helicopter.

In managing the communication parameters used, the system can make adjustments based on the number of corrupted blocks that occur over a designated time period, e.g., the duration of one series of code blocks. In this manner, the number of corrupted code blocks can serve as an indicator of the status and capability for reception in the current conditions rather than making adjustments based on other factors such as link margin. The system then adjusts communication parameters, such as modulation and coding, to achieve reception for which a target number of code blocks are corrupted not fully received. The target number can be a positive integer (e.g., greater than zero), signifying that corruption of one or more code blocks is expected and that the system even manages the communication to increase the number of corrupted code blocks up to the target. While the number of corrupted code blocks per series is less than the target number, the system can progressively use increasingly aggressive communication parameters (e.g., providing higher throughput with higher code rate, more information-dense modulations, etc.), until the periodic blockage causes the target to be reached.

In some implementations, the target number of corrupted code blocks per series is a number that is equal to or slightly less than the number of code blocks for which the ULPE arrangement enables the receiver to recover. In this manner, the technique manages the communication parameters to maximize the throughput to a point that the error checking and correction can recover. This can take the error checking and correction functionality into account when setting the parameters, and not setting parameters simply to achieve a link margin or other channel measure that does not reflect the robustness gained through the coding scheme. As a result, the system can better achieve the full potential throughput that is available using the error correction tools in the system.

Transmissions in the system can be structured as a series of code blocks. Each series has a defined length, e.g., a predetermined number of code blocks, that represents a single burst size or transmission frame. The series of code blocks can be defined so that the transmission duration for each series of code blocks (e.g., each frame, or at least each column within a frame) is the same duration or shorter than the period of the periodic blockage. For example, each series of code blocks can form a transmission frame or transmission group with a consistent, predetermined number of equally-sized code blocks from one series to the next. The ULPE structure can arrange series of code blocks in rows and columns, with a code block of error checking and correction data in each column. This enables the receiver to recover the data for one interruption in the column, as long as the duration of interruption is no longer than the duration of transmission of one code block worth of data. For example, if the ULPE structure defines a series to include 12 equal-sized code blocks, arranged in three columns and four rows, the receiver can use the ULPE data to recover data of three partially corrupted code blocks per 12-code-block series (e.g., correcting one code block per column). The system may also be able to recover one code block worth of data per column as long as the corruption occurs in a continuous segment of the transmission. In other words, the arrangement can allow recovery of data for a blockage that spans the boundary between adjacent code blocks (e.g., in a situation where, within a row, corruption occurs at an end portion of the first code block and continues into the beginning portion of the second code block). To facilitate error correction and recovery, the ULPE structure and code block size can be set so that (1) the duration for transmission of a code block is greater than the duration of each instance of the periodic blockage, and (2) the duration for transmission of a column of code blocks is less than the blockage duration.

The system can set a target number of corrupted code blocks per series, such as a target of two corrupted code blocks per ULPE structured series of code blocks for reception. This target sets the desired tradeoff between throughput and reliability, and sets a desired operating point to maintain in the system. In some implementations, the target number of corrupted code blocks per series is a number that is equal to or slightly less than the number of code blocks for which the ULPE arrangement enables the receiver to recover.

In some implementations, the corrupted code blocks that are counted toward the target are those that cannot individually be corrected by their own parity data and error correction coding. For example, an LDPC-coded code block that has errors but which can be corrected using the information received for the code block, would not be considered corrupted. These corrupted code blocks may nevertheless be correctable using the data series as a whole (e.g., using the received data of other code blocks in the column of the ULPE structure).

In short, the communication system can adjust a modulation scheme or a coding scheme for subsequent communications between the helicopter and the ground station, and can achieve a higher throughput by managing the number of corrupted blocks received per series of code blocks than would be achieved by maintaining a fixed link margin. The communication system can monitor effects of the periodic blockage across multiple code blocks, and from the monitoring, determine when the system should increase or decrease throughput in the system. When less than a target or reference number of code blocks per series are corrupted due to the periodic blockage, the communication system can increase throughput by using a higher code rate or a higher-order modulation. When more than the target or reference number of code blocks per series are corrupted due to the periodic blockage, the communication system can reduce throughput with a more conservative coding or the modulation that adjusts throughput to the level supported by channel conditions and the capabilities of the error checking and correction mechanisms.

To further improve the transmission characteristics of the system, transmissions can be made with Gray code signal constellations. For example, for an 8-PSK modulation, each symbol represents three bits of information. The constellation can be arranged with a Gray code so that adjacent symbols in the constellation differ by only one bit. In addition, each symbol can share a bit with the two other symbols nearest to it, making the likelihood of that bit being in error much less likely. This assists the receiver to better predict which bit of a received symbol is in error and so should be corrected. As an example, a modulation may constellation in which a series of symbols are assigned bit values of "101," "110," and "111," respectively. If the symbol for 110 is received and an error is detected (e.g., from a parity check), the fact that the Gray code is used enables the receiver to infer that (1) the error is most likely isolated to a single bit, and (2) the error most likely does not occur in the bits that are common among the nearest symbols (e.g., the initial "1" that is shared between the received symbol as well as the previous and subsequent symbols in the constellation). Thus, the properties of the Gray code enable the receiver to enhance error correction capability by better localizing which bit or bits in a received symbol may need to be corrected.

In one general aspect, a method includes: receiving, by a receiver and from a transmitter, code blocks transmitted on a communication channel according to a first set of communication parameters that comprises one or more of a first modulation used to transmit the code blocks or a first coding used to encode information in the code blocks for transmission; determining a number of corrupted code blocks in a series of the code blocks received by the receiver; determining a number of parity blocks in the series of code blocks; comparing the number of corrupted code blocks in the series of code blocks with the number of parity blocks in the series of code blocks; determining a second set of communication parameters for communication between the transmitter and the receiver based on the comparison of the number of corrupted code blocks in the series of code blocks with the number of parity blocks in the series of code blocks; and communicating the second set of communication parameters to the transmitter for subsequent transmissions by the transmitter to the receiver.

In some implementations, the code blocks are encoded using low-density-parity-check (LPDC) coding; and wherein the second set of communication parameters includes a second modulation that is different from the first modulation, wherein the first modulation and the second modulation are each one of QPSK, 8-PSK, 8+8 APSK, or 8+8+16 APSK.

In some implementations, the method includes determining, based on the determined number of corrupted code blocks, characteristics of a periodic blockage of the communication channel between the transmitter and the receiver, the characteristics comprising (i) a blockage duration indicative of a duration of the blockage and (ii) a blockage interval indicative of a period of time between the starting times of two successive blockage events.

In some implementations, the transmitter is a transmitter of a satellite, and wherein the receiver is mounted on a helicopter that is in flight, and the receiver is oriented to communicate with the transmitter along a path such that the periodic blockage is caused by rotation of rotor of the helicopter periodically blocking the path between the receiver and the transmitter.

In some implementations, determining the second set of communication parameters comprises: determining, based on the comparison, that the number of corrupted code blocks is less than the number of parity blocks; and in response to determining that the number of corrupted code blocks is less than the number of parity blocks, determining the second set of communication parameters to include a second coding that provides a higher code rate than the first coding.

In some implementations, determining the second set of communication parameters comprises: determining, based on the comparison, that the number of corrupted code blocks is less than the number of parity blocks; determining that a set of codings available for communication between the transmitter and receiver does not include a coding with a code rate greater than a code rate of the first coding of the first communication parameters; and in response to determining (i) that the number of corrupted code blocks is less than the number of parity blocks and (ii) that the set of codings available for communication between the transmitter and receiver does not include a coding with a code rate greater than a code rate of the first coding of the first communication parameters, selecting the second set of communication parameters to include a second modulation that provides higher throughput than the first modulation.

In some implementations, determining the second set of communication parameters for communication between the transmitter and the receiver further comprises: determining a channel quality measure that indicates a condition of the communication channel; and selecting the second set of communication parameters based on the determined channel quality measure, wherein the receiver stores data that identifies different communication parameters and different values or ranges of channel quality measures that correspond to the different communication parameters, and wherein at least one communication parameter in the second set of communication parameters is selected based on determining that the determined channel quality measure corresponds to the value or range of channel quality measures that the stored data indicates as corresponding to the at least one communication parameter.

In another general aspect, a communication device can use a modulation scheme that involves symbols arranged in multiple rings of constellation points, wherein each of the rings corresponds to a different level of signal amplitude. The constellation points on each ring are spaced apart to correspond to different phase positions. For at least some of the rings, the symbols around the ring are assigned to constellation points such that a first multi-bit portion of the symbols changes with changes in phase according to a Gray code sequence. The symbols around the ring are also assigned to the constellation points such that a second multi-bit portion of the symbols changes with amplitude according to a Gray code sequence.

In some implementations, the communication device includes a transmitter configured to modulate data for transmission using the modulation scheme.

In some implementations, the communication device includes a receiver configured to demodulate data transmitted using the modulation scheme.

In some implementations, the modulation scheme uses three or more rings of constellation points.

In some implementations, the modulation scheme uses rings of constellation points having different amounts of constellation points.

In some implementations, the modulation scheme is an 8+8+16-APSK modulation scheme.

In some implementations, a same first Gray code scheme is used to assign the symbols for each of the rings of the symbol constellation.

In some implementations, the values of the first multi-bit portion of the symbols are aligned such that, for phase positions where multiple of the rings each have a constellation point located, the same value of the first multi-bit portion is used for the constellation point for each of the rings. For example, the first multi-bit portion can be consistent across each of the rings at the same phase position. In other words, in the constellation, the first multi-bit portion can be amplitude-invariant, so that changes in amplitude do not alter the value of the value in the first multi-bit portion.

In another general aspect, a method includes: receiving, by a receiver, code blocks transmitted on a communication channel according to a first set of communication parameters that comprises a first modulation used to encode information in the code blocks for transmission; demodulating the received code blocks that are modulated with the first modulation, wherein the first modulation uses amplitude phase-shift keying (APSK) and has symbols at each of multiple symbol constellation rings that respectively correspond to different levels of signal amplitude. The constellation points on each ring are spaced apart to correspond to different phase positions. For at least some of the rings, the symbols around the ring are assigned to constellation points such that a first multi-bit portion of the symbols changes with changes in phase according to a Gray code sequence. The symbols around the ring are also assigned to the constellation points such that a second multi-bit portion of the symbols changes with amplitude according to a Gray code sequence.

In some implementations, the rings include a first ring, a second ring, and a third ring.

In some implementations, the first ring corresponds to a first signal amplitude, the second ring corresponds to a second signal amplitude that is higher than the first signal amplitude, and the third ring corresponds to a third signal amplitude that his higher than the second signal amplitude.

In some implementations, the first ring and the second ring each include constellation points representing symbols having at least a first multi-bit portion with a progression of values around the ring that is ordered in a Gray code sequence. The symbols of the first ring and second ring are aligned so that the value in the first multi-bit portion is the same for the same phase position.

In some implementations, the third ring has symbols assigned to have the first multi-bit portion assigned in a progression of values around the third ring that is based on the same Gray code sequence used to set values of the multi-bit portion for the first ring and second ring. The symbols of the third ring are aligned with symbols of the first ring and second ring such that the value in the first multi-bit portion is the same for the same phase position across the first ring, the second ring, and the third ring.

In some implementations, symbols on the first ring and second ring each share a common value at a particular bit position; symbols on the third ring each share a common value at the particular bit position; and the value at the particular bit position is different for symbols on the third ring than for symbols on the first and second rings. As a result, the value of the bit at the particular position (which may or may not be the most significant bit) differentiates symbols between a first group on the first and second rings and a second group on the third ring.

In some implementations, the third ring has pairs of symbols in which each symbol in the pair has the same value in the first multi-bit portion, but a different one of two values in a second multi-bit portion. The symbols in each pairs are arranged adjacent to each other along the third ring.

In some implementations, the first ring and second ring each include eight symbols, and the third ring includes sixteen symbols. The first ring and second ring each have their respective symbols spaced apart by a phase difference of π/4. The third ring includes symbols spaced apart by a phase difference of π/8, and the symbols located at phase positions that are not multiples of π/4 each share the value that is in the first multi-bit portion of an adjacent symbol along the third ring that is located at a phase position that is a multiple of π/4.

In some implementations, the symbol constellation can have more than three rings, and the same types of relationships discussed above (e.g., Gray coding of portions of symbols between rings and Gray coding of portions of symbols within rings) can be maintained.

In some implementations, a method includes: receiving data to transmit in a satellite communication system; modulating a carrier signal to provide the data using an 8+8+16-APSK modulation; and transmitting the modulated signal for transmission in the satellite communication system. The 8+8+16-APSK modulation can use a symbol constellation that includes three rings as discussed below.

In some implementations, a method includes: receiving a signal transmitted in a satellite communication system; demodulating the received signal using an 8+8+16-APSK modulation to recover the data modulated onto the signal; and providing the demodulated data to one or more computers. The 8+8+16-APSK modulation can use a symbol constellation that includes three rings as discussed below.

Other embodiments of these and other aspects of the disclosure include corresponding systems, apparatus, and computer programs, configured to perform the actions of the methods, encoded on computer storage devices. A system of one or more computers can be so configured by virtue of software, firmware, hardware, or a combination of them installed on the system that in operation cause the system to perform the actions. One or more computer programs can be so configured by virtue having instructions that, when executed by data processing apparatus, cause the apparatus to perform the actions.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIG. 4 is a table that illustrates an example modulation selection based on received a signal to noise ratio.

FIG. 5 is a flow diagram that illustrates an example of a process for improving communication in a satellite environment despite a periodic blockage in a communication link.

Like reference numbers and designations in the various drawings indicate like elements.

DETAILED DESCRIPTION

Figure 1A:
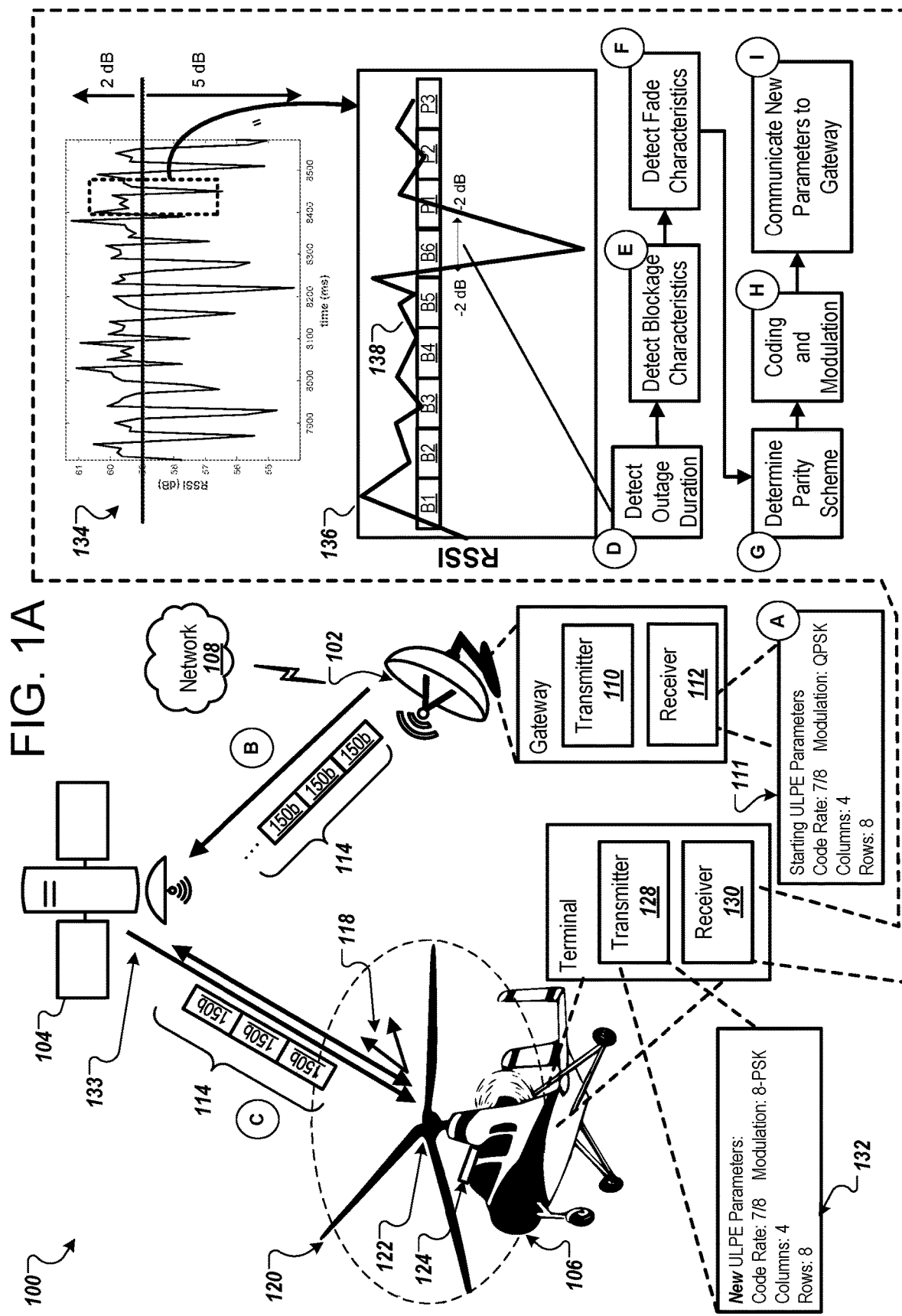
FIG. 1A is a block diagram that illustrates an example of a system for improving communication in a satellite environment despite a periodic blockage in a communication link.

FIG. 1A is a block diagram that illustrates an example of a system 100 for improving communication in a satellite environment despite a periodic blockage in a communication link. For example, the system 100 can adjust parameters for communications in the satellite communication system, such as a modulation scheme or coding scheme, based on characteristics of the periodic blockage. Typically, satellite communication systems can be designed with a link margin to ensure a receiver can properly receive and recover communications that may have been corrupted. The link margin can represent a signal-to-noise ratio (SNR) or signal-to-interference-and-noise (SINR) difference between the minimum expected power received at the receiver's end and the receiver's sensitivity, e.g., the level of received power at which the receiver no longer receives communications accurately. Many systems set a link margin to a particular value, e.g., 3 decibels (dB). However, this approach does not provide the versatility to maximize throughput, especially in situations where robust error checking and correction techniques are applied.

As discussed below, the system 100 can adjust communication parameters including modulation, coding, and transmission frame properties to target a predetermined, non-zero set of errors or corrupted data blocks. This allows the system 100 to operate with more aggressive (e.g., more information-dense, higher-code-rate) parameters, even though some portions of the communication may be lost or corrupted during the periodic blockage using those parameters. When a periodic blockage is present, setting parameters so conservatively as to avoid any information loss may result in very low throughput or may be impossible. By using more aggressive parameters, unrecoverable errors are kept to an acceptable target level while communication in the non-blocked periods occurs with a high bandwidth. In many cases, the substantial improvement to the bandwidth in the non-blocked periods more than compensates for the need to re-transmit any data that is lost in the blocked periods, leading to an overall increase in throughput of the channel despite the presence of the periodic blockage. In addition, the error checking and correcting features of the system 100 can recover from many of the small errors that may occur due to operating closer to the limits of the receiver's capability. Thus, the system 110 can improve throughput in view of the periodic blockage caused by helicopter blades and ensure the receivers in the system 100 can still properly recover data received. FIG. 1A illustrates various operations in stages (A) through (I) which can be performed in the sequence indicated or another sequence.

In particular, the system 100 includes a satellite gateway 102, a satellite 104, and a satellite terminal 124. In the illustrated example, the satellite terminal 124 is mounted on a helicopter 106, although the techniques discussed herein can be applied to receivers in other configurations. The satellite gateway 102 can be connected to a network 108 that includes the Internet, for example. The satellite 104, the satellite gateway 102, and the satellite terminal 124 can be a part of a satellite communication network that includes one or more satellites, one or more gateways, and one or more satellite terminals. Although the techniques described herein are described in terms of a satellite communication system, the techniques can be used in other wireless communication systems.

In some implementations, the gateway 102 can include a transmitter 110 and a receiver 112. Similarly, the satellite terminal 124 on the helicopter 106 can include a transmitter 128 and a receiver 130. The transmitter 110 can transmit data to the receiver 130 using a set of communication parameters. Similarly, the transmitter 128 can transmit data to the receiver 112 using a set of communication parameters. The two sets of communications parameters can be the same or can be different, and both sets can vary over time as conditions change. As will be described, the communication parameters can include ULPE parameters that include a coding scheme, and interleaver parameters, e.g., an interleaver dimension involving one or more of a number of rows, a number of columns, a total number of elements, etc. The coding can be, for example, a forward error correction (FEC) scheme for the communication link, which may be used to counter the channel effects caused by the communication link between the satellite gateway 102 and the helicopter 106. Moreover, the communication parameters can include a particular modulation scheme for modulating the bits to symbols to also aid in offsetting the channel effects caused by the communication link in system 100.

The satellite terminal 124 can be mounted on a top portion of the helicopter 106 for communicating with the satellite gateway 102 through the satellite 104. For example, the satellite terminal 124 can be mounted above a cabin of the helicopter 106, on a nose of the helicopter 106, on a tail or the helicopter 106, in the cockpit of the helicopter 106, within a passenger area of the helicopter 106, or on or in another appropriate area of the helicopter 106. The helicopter 106 can include a rotor 122 with one or more blades 120. As the blades 120 rotate while the helicopter 106 is stationary or moving, the blades 120 can intercept the line of communication 133 between the satellite terminal 124 and the satellite 104 each time one of the blades 120 crosses the line of communication 133. The rotation of the blades 120 causes periodic blockages, e.g., repeated temporary interruptions in the ability of the receiver 130 to receive signals from the satellite 104.

The rotation of the blades 120 cause periodic blockages and an interval between successive blockages from the blades 120 (e.g., from the start of one blockage to the start of the subsequent blockage) is known as the "blockage interval." The blockage interval can vary over time, such as during the course of travel of the helicopter 106 and when the helicopter 106 powers on and powers down. For example, the blockage interval can be a time duration between one blade 120 blocking the line of communication 133 and the next successive blade 120 blocking the line of communication 133. The "blockage duration" can be an amount of time that one individual blade 120 blocks the line of communication as the blade 120 passes between the receiver 130 and the satellite 104.

The change in incident angle 118 can change the blockage interval and/or the blockage duration, as the incident angle 118 affects the width of the shadow of the blade 120 that blocks the line of communication 133, e.g., the size of the shadow of the blade 120 on the receiver 130. The change in incident angle 118 can result from the helicopter 106's maneuvers during its course of travel, e.g., banking left, banking right, nose down, nose up, or accelerating in a particular direction, to name a few examples. For example, the shadow of the blade 120 that blocks the line of communication 133 would be greater for a zero degree incident angle 118 than for a 45-degree incident angle 118, because more surface area of the blade 120 blocks the communication line 133 during the zero degree incident angle 118 as compared to the 45 degree incident angle 118. However, these incident angles are shown as approximate angles for exemplary purposes, and the system 100 can exhibit other incident angles between the receiver 130 and the satellite 104, e.g., by way of a line of communication 133 and the normal angle to the blades 120. The incident angle 118 of the blades can also affect an amount of fading that can corrupt the transmitted code blocks.

As described above, the periodic blockages of the communication link 133 caused by the rotation of the helicopter blades 120 create blade shadows that ultimately generate a noise type known as fading. Fading generally occurs in radio propagation environments where multipath propagation exists resulting in communication paths diverging or changing. Specifically, the fading will change the amplitude and phases of the data transmitted by the gateway 102 and/or the terminal 124 such that the data becomes corrupted. Ultimately, fading can distort or corrupt the transmitted data such that the transmitted data is unrecoverable or a portion of the transmitted data is unrecoverable by the receiver, e.g., receiver 112 and receiver 130.

Fading can affect communications in different communication bands. For example, L-band communication systems, e.g., communication systems operating in a frequency range of L-2 GHz, and S-band communication systems, e.g., communications operating in a frequency range of 1.4-2.2 GHz, can have beam widths from the periodic blockages caused by the helicopter blades 120 with broader blockage intervals and longer durations. However, the fade depth is shallower in L-band and S-band communication systems because the width of one helicopter blade 120 is similar to the wavelength of the particular frequency band, e.g., 20 centimeters (cm) for the L-band and 15 cm for the S-band. For example, the fade depth in an L-band and S-Band communication system can range between 1 dB to 5 dB. In higher frequency bands, such as the Ku-band, e.g., frequency band between 12-18 GHz, and the Ka-band, e.g., frequency band between 26-40 GHz, the beam width from those antennas are sufficiently narrow, and as such, the fade depth caused by the helicopter blades 120 is deep and well defined. For example, the fade depth in these high frequency bands may result in a 5 to 15 dB degradation. The blade can shadow the antenna aperture partially at the onset of the fade and similarly when the antenna moves out of the shadow of the fade.

In order for the system 100 to counter the fade effects of periodic blockages caused by the helicopter blades 120, the system 100 can automatically adjust the communication parameters to increase throughput by supporting higher-order modulations and/or higher code rates. For example, one of the receivers 130 or 112, or a controller or processor of the gateway 102 or the terminal 124 can adjust the communication based on current periodic blockages if the current level of link margin, in combination with the error correction schemes, allows for higher throughput by causing the system to operate closer to the maximum allowed by the current SNR of the receiver and other conditions. These techniques, as will be further described below, can adaptively change the communication parameters over time to enhance the performance of system 100 in view of the fade caused by the periodic blockages by supporting higher-order modulation and higher code rates with improved bandwidth efficiency.

Each transmitter 128 and 110 can transmit data in a frame, e.g., a ULPE frame formed of a number of component code blocks in a predetermined organization. The frame is formed of a series of code blocks that includes a predetermined number of code blocks, where the code blocks in the series each have consistent, predetermined size and the frame itself includes a predetermined number of code blocks. The transmitter 110, for example, can transmit a frame or a series of frames to the satellite 104, and the satellite 104 can retransmit, e.g., forward, the series of frames to the receiver 130. The transmitter 128 of the satellite terminal 124 can perform similar functions, such as transmitting the series of frames to the satellite 104, and the satellite 104 can retransmit the one or more frames to the receiver 112. Both directions of communication can occur simultaneously or at different times.

As mentioned, each frame is composed of a series of code blocks. Each frame can include code blocks with transmitted data (e.g., "data code blocks") and code blocks with error checking and correction information ("parity code blocks"). The data code blocks and parity code blocks are interleaved in the frame for improved robustness. For example, a frame may be defined to be a series of 12 code blocks, organized as three columns and four rows. Each column has one parity code block for error correction in the column. As a result, in this example each column would have four code blocks, three data code blocks and one parity code block. The interleaving can transmit each column in sequence, so the transmission of the frame includes a first set of three data code blocks with the corresponding parity code block, a second set of three data code blocks and its corresponding parity code block, and a third set of three data code blocks and its corresponding parity code block.

Each of the ULPE frames can be generated and transmitted according to a set of communication parameters. The transmitters 128 and 110 can interleave data with error-correcting code (ECC) data to generate the ULPE frame, and then modulate the ULPE frame using a particular modulation scheme. The transmitters 128 and 110 can each use communication parameters that such as interleaving parameters defining the frame structure, the forward error correction (FEC) parameters (e.g., "coding"), and modulation parameters. The system can adapt these parameters over time based on monitored characteristics of the received data (e.g., the frequency and amount of data loss) resulting from the periodic blockage of the helicopter blades 120.

The ULPE frames may each include (1) data code blocks generated using a low-density parity check code (LPDC) and (2) parity code blocks that include ECC data. These code blocks are organized into ULPE rows and columns so the transmitters can interleave the data in rows and columns. For example, the interleaver parameters can specify the number of ULPE rows and the number of ULPE columns used to organize elements into the ULPE code block that is transmitted. The parity code blocks can include any appropriate ECC data, for example, convolutional codes, Hadamard coding, Hamming coding, Reed-Solomon error correction, Reed-Muller coding, and turbo coding, to name a few examples. In some implementations, the parity code blocks represent the result of an XOR operation of all the data code blocks in the column. Examples of modulations include QPSK, 8-PSK, 8+8 APSK, 8+8+16 APSK, 16 QAM, and 32 QAM.

The transmitter 110 generates a set of ULPE frames to be transmitted to the receiver 130 of the helicopter 106. In a frame structure of four columns and 8 rows, the set of code blocks may include, for example, eight rows of code block elements, e.g., a first row with four code block elements, a second row with four code block elements, through a seventh row with four code block elements. The eighth row of code block elements exists for parity data or other ECC data. In this example, the eight rows of four code block elements can be encoded with a particular coding scheme, e.g., LDPC-encoded or otherwise encoded to provide a desired internal FEC code rate. The row of four parity blocks (e.g., one parity block per column) is included to provide parity information for recovering data in data code blocks in their respective columns.

The columns of data code blocks represent the data to be transmitted by the particular transmitter. For example, the data can be video data, telemetry data, audio data, Internet traffic, voice call traffic, or some other form of data to be transmitted. The parity blocks enable a receiver 130 to evaluate each column of received data to determine whether any corruption has occurred in reception of the column. The parity blocks may include parity bits that allow for detecting and correcting errors in the column. For example, the receiver 130 can perform XOR operations across received data code blocks to verify correct reception.

The interleaver parameters can define the number of rows and the number of columns of the ULPE frame. The number of rows in the interleaver parameters can also affect the code rate. The system can use error correction coding within a data code block, and also uses parity coding through the higher-level ULPE framework (e.g., including data code blocks and parity code blocks). The inner code rate represents the amount of data bits out of total bits within a data code block. There is also an outer code rate, representing the amount of code blocks in a frame that are data code blocks out of total code blocks (e.g., data code blocks plus parity code blocks.) For the outer code rate, an 8/9 outer code rate indicates that the ULPE frame can include 8 rows of data code block elements and one row of parity code block elements. In another example, a 1/2 outer code rate indicates that the ULPE frame can include 1 row of data code block elements and one row of parity code block elements. In another example, a 2/3 outer code rate indicates that the ULPE code block can include 2 rows of data code block elements and one row of parity code block elements.

A size of the code block is typically chosen such that a block duration consists of a small number of contiguous code blocks. For example, a transmitter can set a number of columns in the ULPE code block based on the duration of the intermittent blockage of the helicopter blades 120, e.g., an average or maximum duration, over a recent window of time. The number of columns is generally determined so that any individual blockage will not have a duration greater than the duration to transmit one row of a ULPE code block. Thus, the number of columns in the interleaver can be set based on the blockage duration and the duration of individual ULPE code blocks.

In some implementations, the number of rows in each column is typically based on the code rate and the blockage interval. For example, a larger number of rows may be desired for greater transmission efficiency, e.g., a high ratio of data to parity or other ECC information. However, the number of rows can be set so that the total size of the ULPE code block is also short enough that no more than one full duration of the intermittent blockage will coincide with any given ULPE code block. The maximum number of rows should make the time duration of the ULPE interleaver be less than the blockage interval, while the number of rows is at least two including the parity row. More rows provides a higher ULPE outer FEC code rate and results in higher throughput. For example, an overall parity check block P is formed by adding a number of code blocks in modulo-2.

As an example, consider one scenario where the duration of an individual blockage is 3 milliseconds (ms) and the blockages repeat at an interval of 10 ms. Transmission of one code block element may take 1 ms, for example, sending 1,000 symbols at 1 Megasymbol per second (M-symbols/s). In that case, at least 3 columns are included in the ULPE code block and corresponding interleaver. The number of columns needs to be high enough that the transmission duration for each row of the ULPE code block is at least as high as the duration of an individual blockage. To facilitate the adaptation, and to provide a buffer for changing blockage conditions, the number of columns can be increased from this minimum level. In this example, four columns may be used. As a result, the interleaver can arrange the data in four columns. This can ensure that any instance of the intermittent blockage does not affect more than one code block element from each column of the ULPE code block.

The number of columns can be set based on the blockage interval, so that multiple blockages do not occur during the span of a single ULPE column. In other words, the duration needed to transmit a column can be less than the blockage interval. In some implementations, the duration of the entire frame is less than or equal to the blockage interval. For example, if the blockage occurs every 10 ms, the number of rows and columns can be set so the ULPE frame, or at least each column of the frame, has a transmission duration no more than 10 ms. The desired number of columns can be used in this determination of column count. For example, given the use of four columns and other conditions, the transmission of one row can have a duration of 4 ms. This means that only two rows, with a total of 8 ms duration, would be able to be transmitted fully before a second blockage occurs. Accordingly, two rows would be used, with one of them being designated for parity blocks. At the code block element level, this can represent a code rate of 1/2 e.g., not factoring in overhead such as inner error correction within individual code block elements.

In other implementations, the determination of the number of rows can be adjusted based on a link margin of the system 100. In particular, satellite communication systems are typically designed with a link margin amount. As an example, a link margin of 3 dB may be used. As previously indicated, the link margin can represent the difference between the minimum expected power received at the receiver's end, and the receiver's sensitivity, e.g., the received power at which the receiver stops working. In some cases, system 100 may transmit the series of code blocks successfully, despite periodic blockages, with a large amount of link margin available to be exploited. For example, if 3 dB is available to be exploited to push the boundaries of the channel capacity, the system 100 can increase the coding and/or the modulation scheme for higher throughput, while still maintaining a link margin amount, e.g., no less than 1 dB, otherwise the system 100 will stop functioning properly.

As will be further described below, the blocked duration caused by the helicopter blades 120 is equal to the time required to send parity blocks, and the extra link margin can be exploited to determine communication parameters to push through higher throughput. Typically, the unused error correcting capability is one divided by the number of code blocks in a row or greater, necessitated by the fact that the start of fade duration from the helicopter blades 120 is not synchronized with a code block boundary. When the number of code blocks in a row cannot be factorized into a particular value, more than one extra parity block is required. For example, if the number of code blocks in a row is 12, the number of parity code blocks cannot be five, but must be either four or six. One way to remove this hard designation of number of parity blocks in a transmission is for system 100 to allow a small encroachment of fade duration in either a front portion or a back portion of a code block, which will be further illustrated and described below. Modern error correction coding typically can correct a high error rate in a small portion of a code block due to the built-in interleaving capability of the LDPC or turbo codes, for example.

Consider a scenario where the duration of an individual blockage is 15 ms and the blockages repeat at an interval of 60 ms. The duration of an individual blockage can represent a fade duration, a duration that the communication link between the helicopter and the satellite is blocked or impaired. Transmission of one code block element may take 5 ms, for example, sending 1,000 symbols at 5 M-symbols/s. The duration of one frame may be 60 ms when there are 12 code blocks per frame, e.g., a 60 ms frame duration made up of twelve 5 ms per-code-block portions. In a worst-case scenario, when a periodic blockage starts at the exact center of a code block, the code block experiences a maximum fade depth of 2 dB at the end of the code block. Moreover, if the inherent error correction capability of the code block can handle a fade profile starting at mid-point, and increases to a depth of 2 dB at the end of the code block, then the a 75% efficiency level (e.g., outer code rate) is achieved, because nine of the twelve data blocks can include user data, and the within-code-block ECC and ULPE ECC can together provide accurate reception. Similarly, if the blockage starts at the first half of the code block, the last code block corrupted by the fade decreases from a depth of no more than 2 dB and can recover to normal signal strength by middle of the block.

In some implementations, the receivers can perform a method to achieve higher throughput despite periodic blockages. For example, each receiver can include an automatic gain control (AGC). The receiver's AGC can adjust its gain based on a total of signal plus noise power averaged over time. The receiver's AGC can be configured to detect the presence/absence of the blade blockage and the depth of the fade. Based on the presence/absence of the blade blockage and the depth of the fade, the receiver's AGC can aid in selecting the number of parity blocks that is sufficient to cover the fade period covered by the helicopter blades. One way to do this is for helicopter 106, the receiver 130 can select an operating configuration, flight characteristics, and which satellite, e.g., satellite 104, to be used for communication. The receiver 130 can also determine the key communication parameters, including nominal receiver signal to noise (S/N) ratio, the S/N ratio, the periodic interval between blade interruptions, the number of code blocks, and the duration of the blade blockage. The receiver can also select the particular modulation scheme required for communication the series of code blocks.

For a given modulation, an adjustment can alter the number of parity blocks used, in order to maintain reliable communication. For example, in a scenario where 12 code blocks are being transmitted, since the number of parity blocks needs to be an integer fraction of the 12 code blocks, the number of parity blocks can be 2, 3, 4 and 6. The value of the number of code blocks can be close to, but slightly smaller than the actual period of the blade blockage to ensure recovery of corrupted blocks using the type of parity check code. Additionally, the receiver may select the number of code blocks to transmit based on a product of several small integers for easy interleaver and parity check block construction. However, since the fade duration of the helicopter blade 120 sets the minimum number of parity blocks, this choice of a series of code blocks may be limited. For a given modulation to be considered, the receiver can select the minimum number of parity blocks to cover the fade duration. If the selected minimum number of parity blocks is not sufficient, e.g., the number of corruptible code blocks is unrecoverable, then the receiver can try a different number of parity blocks, and determine which number of code blocks allows for recovery of the corrupted code blocks. Another method to improve the throughput in system 100 is to exploit the excess link margin available. For example, the link margin in absence of the blade shadowing can be used to determine the highest-order modulation available to be used, and as such, some link margin is typically allocated to accommodate variation in flight conditions. The allocated link margin can affect the number of parity blocks needed to cover the fade period caused by the helicopter blades.

In some implementations, the system 100 can achieve higher throughput when received signal strength is high. In particular, the system 100 can use a higher-order modulation with appropriate FEC code rate while maintaining a reasonable link margin, such as 3 dB. The selection of the modulation can be based on the measured signal-to-noise ratio as seen by the receiver without blade blockage. Additionally, the selected modulation can also change the value of the transmitted number of code blocks, as less time may be taken to send the same length of a code block. In a typical pragmatic capacity chart, communication throughput typically increases as you increase the modulation by around 8% per dB. Thus, it may be beneficial to reduce the link margin using a more efficient modulation scheme and/or coding scheme combination.

During stage (A), the gateway 102, or more specifically the transmitter 110 can generate a ULPE code block 114 to transmit to the satellite terminal 124. The data within the ULPE code block 114 can include video data, audio data, telemetry data, or other data, to name a few examples. The transmitter 110 can generate the ULPE code block 114 using the parameters 111 identified in FIG. 1A. For example, the parameters 111, which represent starting ULPE parameters in this example, can include a code rate of 7/8, include four columns, eight rows of data blocks, and can modulate and transmit the ULPE code block 114 using QPSK modulation.

For example, the transmitter 110 can generate a series of code block elements 150*b*, such as code block elements (i) B1-B4, (ii) B5-B8, (iii) B9-B12, (iv) B13-B16, (v) B17-B21, (vi) B22-B25, (vii) B26-B29, and (viii) P1, P2, P3, and P4. Thus, the communication parameters 111 can include a 7/8 FEC code rate, at least based on the code block element itself, and an interleaver dimension of eight rows and four columns. The transmitter 110 can modulate the series of code block elements 150*b* in the ULPE code block 114 using QPSK, such that each symbol carries two bits of information. Each code block 150*b* may include any number of bits, such as thousands of bits.

During stage (B), the transmitter 110 can transmit the ULPE code block 114 to the satellite 104 over a satellite network. In particular, the transmitter 110 can transmit the ULPE code block 114 on a row-by-row basis in order to interleave the contents of the four columns. For example, the order of transmission of the code block elements can be B1, B2, B3, B4, B5, B6, B7, B8, B9, B10, B11, B12, B13, B14, B15, B16, B17, B18, B19, B20, B21, B22, B23, B24, B25, B26, B27, B28, B29, P1, P2, P3, and P4. The transmitter 110 may use other communication parameters not currently described here to transmit the ULPE code block 114 to the satellite 104.

During stage (C), the satellite 104 can receive the code block elements from the ULPE code block 114. The satellite 104 can retransmit the received code block elements as they come in to the terminal 124 of the helicopter 106. However, as the satellite 104 transmits the received code block elements of the ULPE code block 114 to the receiver 130 of the satellite terminal 124, the reception of some of the code blocks can be corrupted if a blade 120 blocks the line of communication 133 while the code block element 130*a* transmission passes through the path of the blades 120. In this example, the blade 120 can corrupt code blocks 150*b*. This represents a single blockage by the blade 120 of the helicopter 106, corrupting a single set of code blocks in the ULPE code block 114. This can involve the use of a single rotor blade passing once through a direct line of sight in the communication link 133 between the receiver 130 and the satellite 104. In this example, the duration of the blockage is the length of one and a half code block elements.

For example, as illustrated in graphical representation 134 in system 100, a series of code blocks are received by the receiver 130 in the satellite terminal 124 and the received series of code blocks include some corrupted components caused by the helicopter blades 120. In particular, the graphical representation 134 illustrates a periodic blockage and each blockage includes a particular duration. Each periodic blockage can include a depth or a fade depth based on the blockage caused by the helicopter blades 120 passing through the code blocks during transmission from the satellite 104. The helicopter blades 120 can generate a blade shadow on some of the code blocks, and consequently, the blockage creates a blockage duration, a blockage depth, and a periodicity of the blockage. The periodicity of the blockage can match to a periodicity of a helicopter blade 120's rotation. For example, duration of the blade blockage may be 60 ms and the fade depth of the blockage can be 5 dB.

When the receiver 130 receives the code blocks in the ULPE code block 114, the receiver 130 can determine the communication parameters 111 used to transmit the code elements 150*b*, for example, from messages transmitted by the satellite, by a transmission scheme proposed by the receiver 130, or by another predetermined scheme. For example, the receiver 130 may determine the coding properties used, the frame structure, and the modulation used. This information enables the receiver 130 to determine how to properly demodulate the transmission and extract the data, e.g., map the symbols to bits, and to properly de-interleave the received blocks. In some implementations, the receiver 130 may store the communication parameters 111 used by the transmitter 110 for transmitting the ULPE code block 114. In other implementations, the receiver 130 may determine the communication parameters 111 used by the transmitter 110 for transmitting the ULPE code block 114 by analyzing header information within the code blocks 114.

In some implementations, the receiver 130 can also determine the number of parity blocks within the ULPE code block 114. The receiver 130 may determine the number of parity blocks within the ULPE code block 114 by determining the number of columns transmitted in the ULPE code block 114. Alternatively or additionally, the receiver 130 may determine the number of parity blocks within the ULPE code block 114 by analyzing header information within the code blocks 150*a*, such that the header information distinguishes the code blocks from the parity blocks. Additionally, the receiver 130 may determine the number of rows in the ULPE code block 114 based on the total number of columns and the total number of code block elements. For example, the receiver 130 may determine the number of rows in the ULPE code block 114 by dividing the total number of code block elements by the total number of determined columns.

During stage (D), the receiver 130 can detect an outage duration based on a number of corrupted code block elements. In particular, the receiver 130 can analyze the parity blocks of the ULPE code block 114 to verify the integrity of the data that was transmitted. For example, the receiver 130 can determine that a number of code blocks were corrupted during the transmission of the ULPE code block 114. In this example, there are two corrupted code blocks and the other code blocks were correctly received. Based on the determination that two code blocks were corrupted, the receiver 130 can measure the outage or blockage duration as well as the blockage interval caused by the blades 120 of the helicopter 106.

The receiver 130 can determine or measure the outage duration based on a time duration of the number of consecutive code blocks that are corrupted. The receiver 130 can determine that a particular code block is corrupted when the ECC method, e.g., the inner LDPC analysis, fails to converge to an accurate codeword. For example, the receiver 130 may determine the duration of a code block element based on a given symbol rate. This code block element transmission duration can represent a time duration in which the transmitter 110 transmits the code block element. Based on the duration of the code block element and a number of consecutive number of code block elements that are corrupted, the receiver 130 can determine the blockage duration by, for example, multiple the duration of a code block element transmission multiplied by the number of consecutive code block elements that are corrupted, for example.

In some implementations, the receiver 130 can perform further functions on the detected blockage to fine tune the detected outage duration. For example, the receiver 130 can evaluate the received signal strength indicator (RSSI) of the received code block and compare the RSSI to a threshold value. If the receiver 130 determines the RSSI of the received code block is below a threshold, the receiver 130 can determine that the portion of the received code block is corrupted. Alternatively or additionally, the receiver 130 can average or determine a value that normalizes the number of individual blockage durations to improve the detection of the blockage duration.

During stage (E), based on the determined blockage duration, the receiver 130 can then determine one or more additional blockage characteristics. For instance, the receiver 130 can determine the blockage interval in the ULPE code block 114. In some implementations, the receiver 130 can determine an estimated blockage interval using the rotational speed of the helicopter blades 120. For example, the receiver 130 may determine based on a traveling speed of the helicopter 106, a corresponding rotational speed of the helicopter blades 120. The rotational speed of the helicopter blades 120 may define the blockage interval of the periodic blockage of the communication link 133 over a period of time.

Nevertheless, the helicopter rotor speeds need not be known precisely or used, and the system can still measure the blockage interval from the effect on communications. As an example, the receiver 130 can determine or measure a number of non-corrupted code block elements that were received after the first blockage but before a second blockage, e.g., with no intervening corrupted code blocks between the first and second blockages. The receiver 130 can determine a sum of the number of corrupted code block elements and the number of non-corrupted code block elements from the start of one blockage to the beginning of the next blockage. Then, the receiver 130 can determine the blockage interval by multiplying the duration of a code block element transmission, determined as described above, by the sum of the number of corrupted code block elements and the number of non-corrupted code block elements between the first and second blockages. The receiver 130 may use this comparison to predict future blockages for subsequent transmissions.

For example, as illustrated in system 100, the receiver 130 can determine the blockage duration by analyzing a portion of the received signal as illustrated in graphical representation 134. In particular, the receiver 130 can analyze received signal strength and received data for a portion of the transmission identified in the figure assection 136 of the graphical representation 134. The section 136 can represent a time period of one blockage duration that includes non-corrupted and corrupted code blocks. For example, as shown in system 100, data code blocks 1 through 5 and parity code blocks 2 and 3 are not corrupted and code block 6 and parity block 1 are corrupted. The receiver 130 can first measure the blockage duration by calculating the time duration of data code block 6 and parity code block 1. The receiver 130 can determine the blockage interval by measuring the period of the blockage duration. For instance, the receiver 130 can measure the blockage interval by measuring the duration of the uncorrupted first five code blocks, e.g., data code blocks 1-5, and the duration of the corrupted two blocks, e.g., data code block 6 and parity code block 1.

Then, the receiver 130 can measure the blockage interval over multiple ULPE code blocks. The receiver 130 can measure the blockage interval over a first ULPE code block, and measure a second blockage interval over the second ULPE code block. If the blockage interval over the first ULPE code block and the second blockage interval over the second ULPE code block are similar, then the receiver 130 can indicate it has determined the blockage interval. In the illustrated example, if one code block takes 5 ms to transmit, then the blockage duration can be 10 ms, e.g., 5 ms per code block multiplied by two code block elements is 10 ms, and the blockage interval can be 35 ms, e.g., seven code block elements multiplied by 5 ms per code block is 35 ms. In some implementations, the blockage duration and the blockage interval change based on the flight trajectory and the incident angle 118 of the helicopter 106. Thus, the receiver 130 can continuously determine the blockage duration and blockage interval over time for generating new ULPE parameters.

During stage (F), the receiver 130 can measure the fade characteristics corresponding to the received ULPE code block 114. The receiver 130 can perform processes to determine characteristics of the fading caused by the helicopter blades 120. For example, the receiver 130 can provide the received ULPE code block 114 through an analog-to-digital converter (ADC) to sample and quantize the received ULPE code block 114 to indicate magnitude values of the received ULPE code block 114. The receiver 130 can analyze within the blockage duration the quantized values to determine, for example, a slope of the fade detected at the start of the blockage duration, a slope of the fade detected at the end of the blockage duration, and a magnitude of the fade depth.

The slope of the fade detected at the start of the blockage duration and the slope of the fade detected at the end of the blockage duration may be useful in assisting the receiver 130 in determining a new modulation scheme or a new coding scheme for subsequent transmissions between the gateway 102 and the satellite terminal 124. Moreover, the magnitude of the fade depth can be useful in determining whether the received signal strength exceeds that of the link margin. If the receiver 130 determines that the fade depth is greater than the link margin amount, then the receiver 130 may determine that a lower modulation and/or coding scheme is required. Alternatively, if the receiver 130 determines that the fade depth is less than the link margin amount, then the receiver 130 may determine to use a higher modulation scheme and/or a coding scheme that increases throughput over the communication link 133.

During stage (G), the receiver 130 can use the blockage characteristics and fade characteristics to determine a parity scheme that maximizes the data throughput for future communications between the gateway 102 and the helicopter 106. For example, the receiver 130 can determine new interleaver parameters, different number of parity blocks, and other characteristics, such as symbol rate and potentially even transmit frequency. The receiver 130 may determine a new set of interleaver parameters based on the blockage duration. Additionally, the receiver 130 can determine a new number of rows for the interleaver parameters to reduce the ULPE interleaver duration to be less than the determined blockage interval.

For example, the receiver 130 can determine the number of rows for future communications based on the determined blockage interval. For example, the number of rows can be equal to the duration of the blockage interval divided by the time duration to transmit an entire row of columns. For example, if there are three columns, the number of rows can equal to the block interval divided by the time duration to transmit for code block elements (one in each column).

Once the new set of interleaver columns and rows have been determined, the receiver 130 can determine a new set of parity blocks. The number of parity blocks based on the number of determined columns, for example. Each parity block may be determined, for example, by XOR'ing each data block together in a column to provide a resultant parity block. The newly determined parity block can then be appended to the bottom of the column. The receiver 130 can do this for each of the newly determined code blocks in their respective columns. The receiver 130 can use any ECC scheme necessary, e.g., turbo coding, CRC, or other EEC coding mechanisms.

Figure 1B:
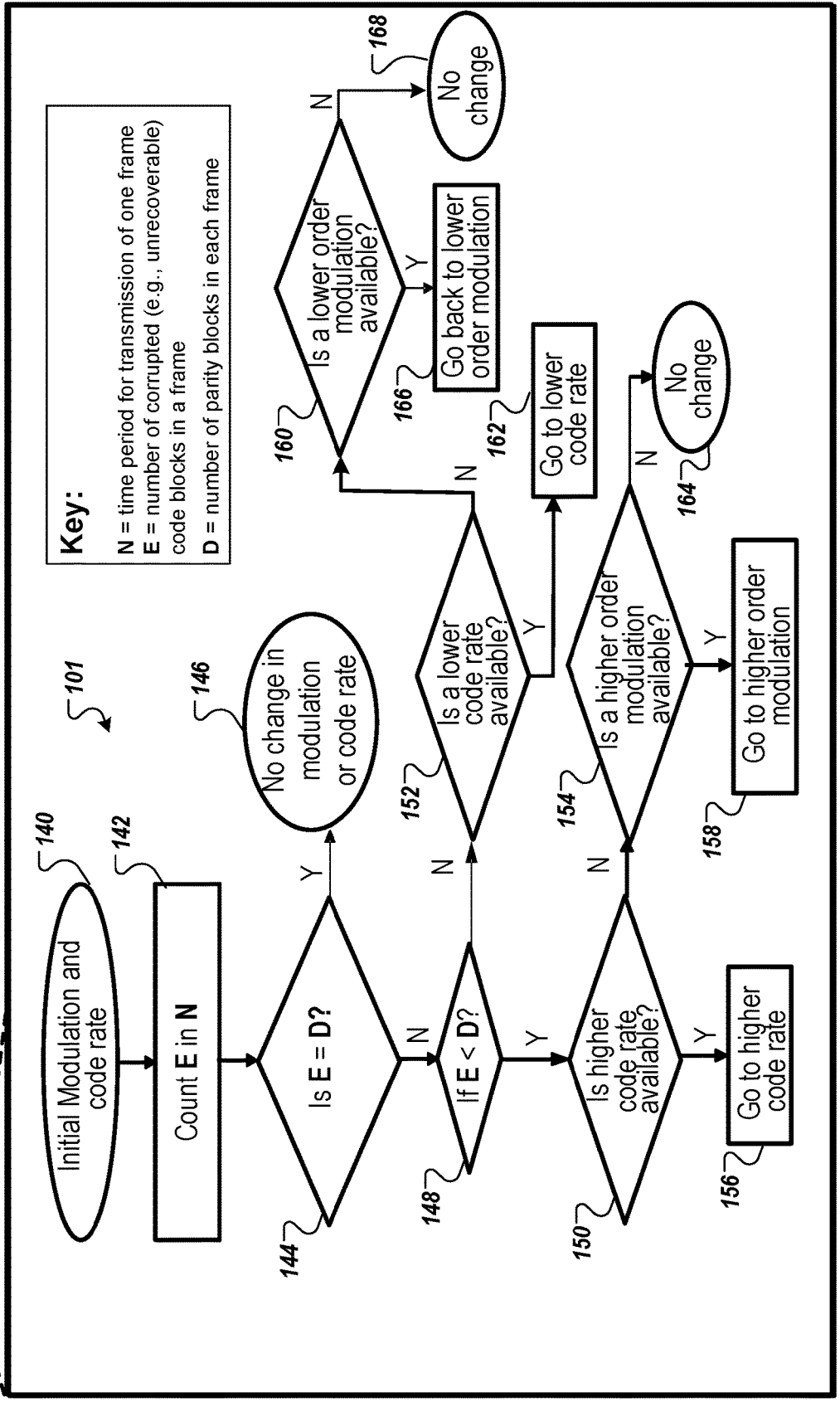
FIG. 1B is an example flow diagram that illustrates modifying modulation and code rate based on a number of corrupted blocks in a frame.

During stage (H), the receiver 130 can determine a new coding and/or modulation scheme based on the impact of the blockage duration, blockage interval, and fade characteristics on communications. Referring to FIG. 1B, the process 101 illustrates a process to determine whether to increase or decrease the modulation or coding scheme, or to perform a no-operation (No-op), depending on the measured blockage characteristics. In some implementations, the process 101 aids the receiver 130 in determining a modulation and/or coding scheme using a table such as one shown in FIG. 4. Additionally, the process 101 aids the receiver in determining the number of parity blocks that is needed to cover an entire blockage period by taking into account the asynchronous relationship between the blade rotation and parity code block boundary.

In particular, once the gateway 102 and the satellite terminal 124 have established reliable reception between one another, the receiver 130 of the satellite terminal 124 can analyze the designed link margin and the practical link margin available to adjust the modulation and coding scheme. For example, the receiver 130 can determine that the system 100 was designed with a link margin of 3 dB. Then, when an ULPE code block 114 is received from the gateway 102, the receiver 130 can determine if the actual margin is excessive or not sufficient. If the receiver 130 determines that the actual margin is excessive, e.g., if the maximum number of erased or corrupted code block is at least one less than the designed erasure capability, then the receiver 130 can request to move to a higher inner code rate. In particular, the receiver 130 can detect an inner code block error and erase them based on either (i) a Cyclic Redundancy Check (CRC) of the decoded information or (ii) simply using the parity check equations of the inner code.

After the receiver 130 has instructed the gateway 102 to move to a higher coding scheme, by way of sending instructions to the gateway 102, the receiver 130 can wait to receive future ULPE code blocks from the gateway 102. When the receiver 130 does receive the future ULPE code blocks with the higher code rate, the receiver 130 can analyze the received future ULPE code blocks and analyze if the number of erased code blocks exceed the designed value. If the receiver 130 determines number of erased code blocks does exceed the designed value of erased code blocks, then the receiver 130 can instruct the gateway 102 to move to a lower coding scheme. At this point, if the number of erased blocks does not exceed the design value or fall below the designed value, then a maximum throughput for the time being has been achieved.

When the receiver 130 determines that it becomes more efficient to use a higher-order modulation with lower code rate to achieve a similar throughput, similar iterative procedures can be performed to request for higher-order modulation, using a value of a number of code blocks to be transmitted in the ULPE code block for the higher-order modulation and a new coding scheme with a new code rate. In some implementations, the receiver 130 can perform hysteresis to ensure changes between modulation and coding schemes of subsequent communications are performed without too much changing. By averaging or performing some statistical analyses on the determination of code rate and/or modulation schemes, the receiver 130 can ensure the code rate and/or modulation schemes are not changed so often that processing at the terminals becomes in excess.

The process 101 illustrates a process that can be performed by the receiver to determine a change or no change in modulation and/or coding scheme. In particular, the receiver 130 in the satellite terminal 124 or the receiver 112 in the gateway 102 can perform this process 101. In some cases, each pass of process 101 can be performed on a periodic frequency, such as 1 or 2 times per second. Alternatively, the process 101 can be performed each time the receiver receives a new ULPE code packet from a transmitter.

The system can provide hysteresis and reduce the frequency at which changes are made. In some cases, a link margin, e.g., 1 dB, can be maintained to limit the instances that changes are made to the code rate and/or modulation scheme. For example, rather than maximizing the throughput, the system can require a link margin of at least 1 dB before any change is made to a higher code rate or higher-order modulation.

Initially, at block 140, the receiver can start with an initial modulation and an initial code rate. The initial modulation can be one of, for example, various schemes of PSK, QAM, and amplitude modulation, to name a few examples. The initial code rate can be one of, for example, 1/2, 2/3, 3/4, 5/6, 7/8, and other code rates for different FEC coding schemes.

At block 142, the receiver 130 can receive the ULPE code block from the transmitter 110 at the gateway 102, for example. Alternatively, the receiver 112 can receive a ULPE code block from the transmitter 128, in other examples. The receiver 130 can perform a process of determining a count E, where E represents the number of corrupted or unrecoverable code blocks in a frame, in a period N, where N represents a time period for transmission of one frame. The key shown in the process 101 illustrates the descriptions of the variables. Additionally, the key indicates D represents the number of parity blocks designated in each frame. Thus, the receiver 130 can count the number of corrupted or unrecoverable code blocks in a time period for transmission of one frame. The process for determining the number of corrupted or unrecoverable code blocks is similar to the process described above.

At block 144, the receiver 130 determines whether the number of corrupted code blocks in a frame, e.g., E, is equal to the number of parity blocks in a frame, e.g., D. If the receiver determines that the number of code blocks in a frame is equal to the number of parity blocks in a frame, then at block 146, the receiver 130 does not change either the modulation scheme or the code rate for subsequent transmissions between the gateway 102 and the satellite terminal 124. Thus, the transmitter continues to transmit code blocks at the designated modulation and coding scheme as maximum throughput is currently being achieved with these communication parameters.

However, if the number of corrected code blocks in a frame does not equal to the number of parity blocks in a frame, then at block 148, the receiver 130 determines whether the number of corrupted code blocks in a frame is less than the number of parity blocks in a frame. If this is the case, then the receiver 130 can determine that excess link margin exists and that either a higher coding scheme or a higher-order modulation can be used to improve the throughput of system 100. In this case, the receiver 130 can determine, at block 150, if a higher code rate is available. If the receiver 130 determines that a higher code rate is available, then at block 156, the receiver 130 can instruct the gateway 102 to communicate at the higher code rate for subsequent transmissions. For example, the receiver 130 may move from a code rate of 1/2 to a code rate of 3/4, or from a code rate of 5/6 to a code rate of 7/8, to name a few examples.

If at block 148, the receiver 130 determines that the number of corrupted code blocks is not less than the number of parity blocks in a frame, then the receiver 130 can determine that excess link margin does not exist and that the communication between the gateway 102 and the satellite 124 needs to either reduce its code rate or modulation scheme. At block 152, the receiver 130 can determine whether a lower code rate is actually available. If the receiver 130 determines that a lower code rate is available, then at block 162, the receiver 130 can instruct the gateway 102 to communicate at a lower code rate for subsequent transmissions. For example, the receiver 130 may move from a code rate of 3/4 to a code rate of 1/2, or from a code rate of 7/8 to a code rate of 5/6, to name a few examples.

If the receiver 130 at block 152 determines that a lower code rate is not available, then at block 160, the receiver 130 determines if a lower-order modulation is available. If the receiver 130 determines that a lower-order modulation is not available, then at block 168, the receiver 130 does not change the modulation or the coding scheme because the lowest modulation and coding schemes have been met. However, if the receiver 130 determines that a lower-order modulation is available at block 152, then the receiver 130 can instruct the gateway 102 to communicate at a lower-order modulation for subsequent transmissions. For example, the receiver 130 may move from a modulation scheme of 64 QAM to 16 QAM, from 8-PSK to QPSK, or from 8+8+16 APSK to 8+8 APSK, to name a few examples.

If the receiver 130, at block 150, determines that a higher code rate is not available, then the receiver 130 can determine whether a higher-order modulation is available at block 154. If the receiver 130 determines that no higher-order modulation is available, then the receiver 130 does not change the modulation or the coding scheme because the highest modulation and coding schemes have been met at block 164. Alternatively, if the receiver 130 determines that a higher-order modulation is available at block 158, then the receiver 130 can instruct the gateway 102 to communicate at a higher-order modulation for subsequent transmissions. For example, the receiver 130 may move from a modulation scheme of 16 QAM to 64 QAM, from QPSK to 8-PSK, or from 8+8 APSK, to name a few examples.

In some implementations, the receiver 130 can define an order of the coding schemes and an order of the modulation schemes based on different characteristics. For example, the receiver can define the order of the coding schemes based on an amount of throughput each coding scheme typically offers when paired particular modulation schemes. In other examples, the receiver can define the order of the coding schemes based on an amount of bit error rate (BER) the coding scheme typically can achieve. In other examples, the receiver can define the order of the coding schemes based on (i) the number of columns, (ii), the number of rows, or (ii) the number of parity bits designated according to the particular coding scheme.

The receiver can define the order of the modulation based on the number of bits per symbol—the greater the number of bits per symbol, the higher the order of that modulation scheme. In other examples, the receiver can define the order of the modulation based on a distance between each of subsequent symbols. For example, in the modulation scheme of Gray-coded QPSK, the distance between 00 and 01 is greater than the distance between 000 and 001 in Gray-coded 8-PSK, and thus, Gray-coded QPSK would be ranked higher than Gray-coded 8-PSK. Other ranking schemes are also possible.

By including criteria for ranking the coding and modulation schemes, a designer can have flexibility in terms design constraints include coding and modulation schemes. The criteria can be based on improving BER, improving throughput, improving the distances between symbols to ensure less errors, and other criteria. Additionally, the receiver can ensure that the symbols are encoded with gray coding, such that the ordering of the successive symbols for the modulation scheme only differs by one bit. Gray coding is particularly beneficial in the case of multi-ring constellation in which neighboring rings differ in only 1 bit. An APSK modulation can be used, with the amplitude being used to encode the bit(s) used to select which of the rings of the constellation is used. Signal fade is most likely to affect the amplitude of the received signals, and because the constellation uses the amplitude to encode the ring selection, the error can be limited to a single bit. In other words, even if there is an error selecting the correct ring, the remaining bits received will most likely be correct. Additionally, state-of-the art turbo and LDPC codes are adept in correcting single bit errors, which further improves performance of the system (e.g., by reducing the error rate for reception).

The receiver 130 can periodically and/or repeatedly measure the blockage duration, the blockage interval, and execute the process 101 to determine a new set of communication parameters for subsequent transmissions. For example, as the blockage duration and/or the blockage interval increases or decreases, the flow diagram 201 may indicate the receiver 130 to adjust the corresponding interleaving parameters, the modulation scheme, and/or the coding scheme used for subsequent transmissions. When the receiver 130 determines that an excess of link margin exists, e.g., by determining the number of corrupted blocks is less than the number of designated parity blocks, then the receiver 130 can seek to improve throughput by choosing a higher-order modulation or coding scheme, as indicated above. By selecting a high order modulation or higher coding scheme, the excess link margin should shrink. As long as the number of corrupted blocks does not exceed the number of designated parity blocks for subsequent communications, the receiver may seek to improve throughput by adjusting the modulation and/or coding scheme. Additionally, the interleaving parameters can be adjusted such as the number of rows or number of columns based on the blockage duration. For example, as the blockage duration increases, the number of columns can be increased.

Returning back to FIG. 1A of system 100, during stage (I), the transmitter 128 of the satellite gateway 124 can transmit, to the gateway 102, the data according to the new communication parameters 132. For example, after the coding and modulation was performed during stage (H), the receiver 130 determines that a new modulation scheme was selected, e.g., 8-PSK. Thus, the new communication parameters 132 provide a code rate of 7/8, specify a modulation scheme of 8-PSK, set the number of columns to 4, and set the number of rows to 8. The transmitter 128 of the helicopter 106 can transmit the new communication parameters 132 as a series of code blocks to the receiver 112 of the gateway 102 over the communication link 133 through the satellite 104. When the receiver 112 receives the series of code blocks that include the new communication parameters 132, the receiver 112 can transmit the new communication parameters 132 to the transmitter 110. The receiver 112 can determine the new communication parameters 132 from the received series of code blocks by demodulating and decoding the data within the series of code blocks.

After the transmitter 110 receives the new communication parameters 132 from the receiver 112, the transmitter 110 can transmit the series of code blocks to the satellite terminal 124 over the communication link 133 using the new communication parameters 132. The transmitter 110 can use communication parameters set forth by the satellite terminal 124. Additionally or alternatively, the transmitter 128 can use communication parameters set forth by the gateway 102. The transmitters may notify the receivers when the communication parameters are set to be used in the future so that the transmitters and receivers communicate use the same communication parameters.

Figure 1C:
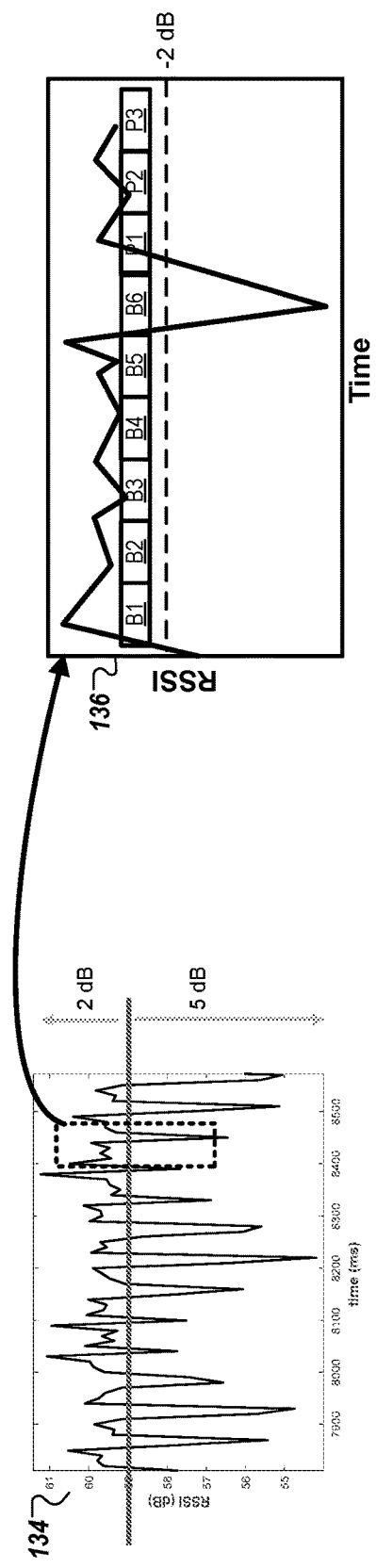
FIG. 1C is a diagram that illustrates an example of outage duration in a frame of code blocks during communications with a periodic blockage.
Figure 1C:
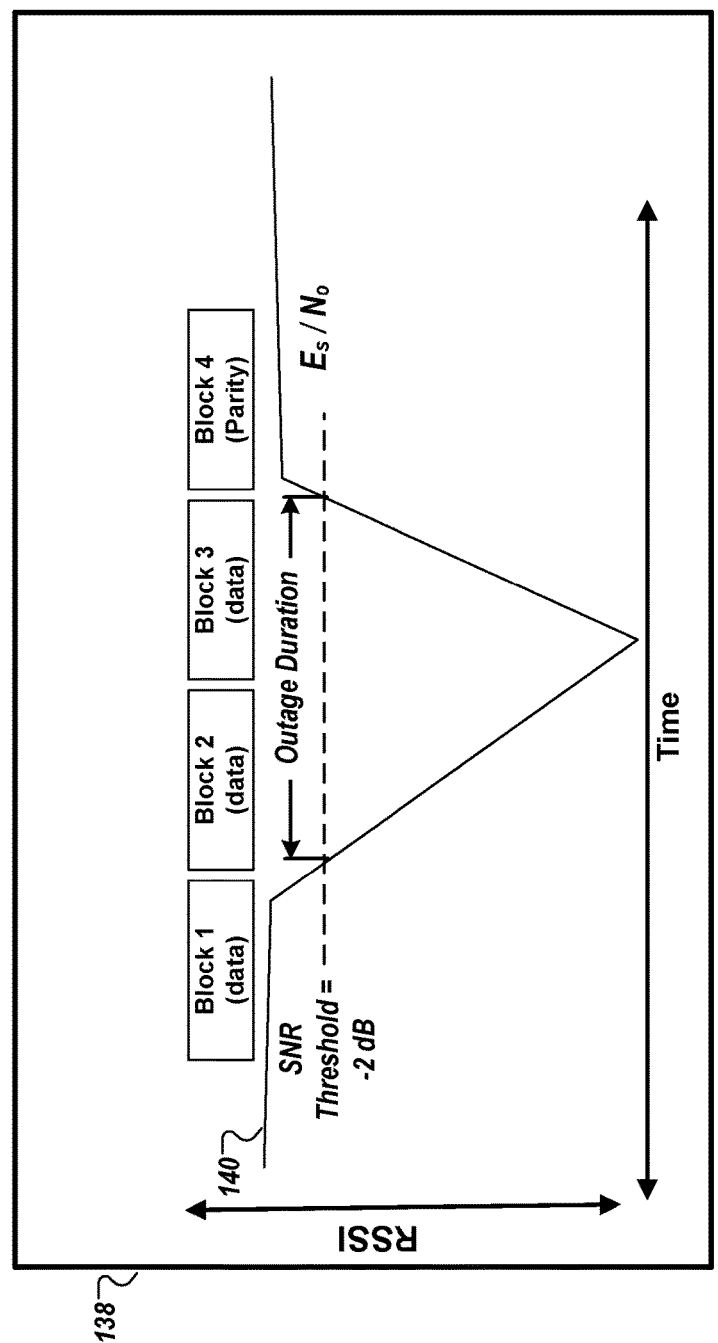

FIG. 1C is illustrates an example of outage duration in a frame of code blocks during communications with a periodic blockage. In particular, the diagram illustrates a clearer and more and illustrative view of an outage duration over a frame.

For example, FIG. 1C illustrates the graphical representation 134 that was shown in FIG. 1. The graphical representation 134 illustrates how periodic blockages affect the received signal strength indicator (RSSI) for the received code blocks, where the blockages are caused by the helicopter blades' periodic motion. The section 136 shows in greater detail a time period in which a series of 9 code blocks, indicated as B1-B6 (data code blocks) and P1-P3 (parity code blocks), are transmitted. Labels for the time periods in which the different code blocks are transmitted are overlaid onto the RSSI line chart for reference. The time period shown in section 136 starts near the end of a first blockage instance. Transmission of the code block B1 begins at this time, but because the RSSI is greater than the threshold, the code block can still be recovered accurately in this case. In other words, although there is reduced signal strength at this part of the blockage (e.g., the trailing end of the helicopter blade passing), the signal strength is not lowered at that moment below the level that permits reception. In addition, or alternatively, the error correction coding, the LDPC transmission structure, and the Gray coding of the signal can individually or together allow minor errors to be detected and corrected despite the slight impairment to the reception of code block B1.

The section 136 shows that code blocks B2-B5 are receive correctly, as RSSI is above the reception threshold. However, another instance of the periodic blockage during transmission of code blocks B6 and P1, and RSSI falls below the reception threshold during transmission of both of these blocks. As a result, code blocks B6 and P1 may be corrupted (e.g., incomplete or with unrecoverable errors).

Diagram 138 show a more idealized representation of a single blockage instance. In particular, the diagram 138 illustrates a series of four code blocks that can be data code blocks or parity code blocks. Here, two code blocks (e.g., Blocks 2 and 3) out of the four code blocks are unrecoverable even with FEC and ULPE coding methodologies. The effect of the blockage spans at least a portion of each of the four code blocks. However, because the beginning of the blockage starts near the end of transmission of Block 1, the received signal strength throughout transmission of Block 1 is still within the SNR threshold value of −2 dB, and the receiver can still recover the entire Block 1. Once the received signal strength dips below the threshold value of −2 dB, however, reception may be impaired, for example, if the receiver cannot converge on a codeword that corresponds to the Block 2 (e.g., signals the beginning of Block 2), or if FEC coding and the ULPE coding do not effectively correct for errors in symbols received.

In diagram 138, two blocks in the sequence of four are corrupted. The receiver can use the process shown in FIG. 1B to assess whether changes to the communication properties should be made. Following the steps shown in the process 101, the receiver uses the nature of the frame structure to assess the communication efficiency. If the frame includes only the blocks shown (e.g., three data blocks and one parity block), then the number of corrupted blocks per frame, E, is 2, and the number of parity blocks per frame, D, is 1. The receiver would determine that, because E>D, then the current modulation and/or coding parameters are too aggressive and should be adjusted if possible to provide better robustness to interference even if a reduction in throughput results. The condition of E>D indicates that there are one or more corrupted code blocks for which there is no corresponding parity code block that can be used to recover the corrupted data. As a result, the process shown in FIG. 1B can be used to shift to lower throughput with higher link margin (e.g., a lower code rate and/or a lower-order modulation) to reduce the effect of the periodic blockages on reception.

Depending on the frame structure and blockage characteristics, in some situations the blockage shown in diagram 138 may not require any adjustment or may allow for higher throughput communication. As an another example, the sequence of code blocks in diagram 138 may be part of a larger frame structure, e.g., as only four blocks out of a frame structure with 8 data blocks and 4 parity blocks, and the blockage interval can be long enough that only a single blockage instance occurs in this frame. In this situation, the number of corrupted blocks per frame E=2 remains the same as the previous example, but the number of parity blocks per frame D=4 is higher. In this case, E<D, which indicates that there is more than a sufficient number of parity blocks to correct for the corrupted blocks. As a result, the receiver can determine to use communication parameters with higher throughput and lower link margin (e.g., higher code rate, higher-order modulation) and rely on the correction provided by the parity blocks to remedy errors that occur. Over multiple cycles of assessment and parameter updates, the receiver and the rest of the system can incrementally adjust the modulation and coding to coordinate use of progressively higher-throughput communication parameters, until the four blocks are corrupted per frame, e.g., E=D.

As a final example, if the scenario in diagram 138 represents part of a frame structure with 6 data blocks and two parity blocks, and blockage instances are spaced apart so that only a single blockage event occurs per frame, then the number of corrupted blocks per frame and the number of parity blocks per frame are equal, e.g., E=D. In this case, the system maintains the current communication parameters.

Figure 2B:
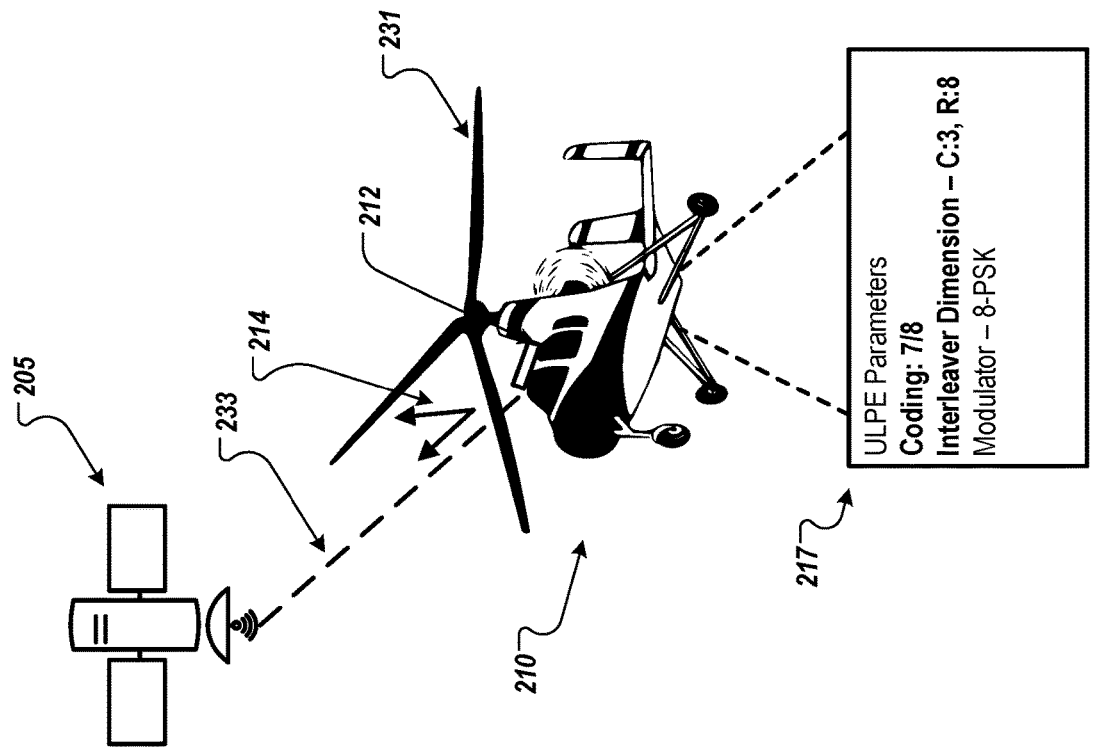
FIGS. 2A-2B are diagrams that illustrate example components for transmission and reception of code blocks with periodic blockages.
Figure 2A:
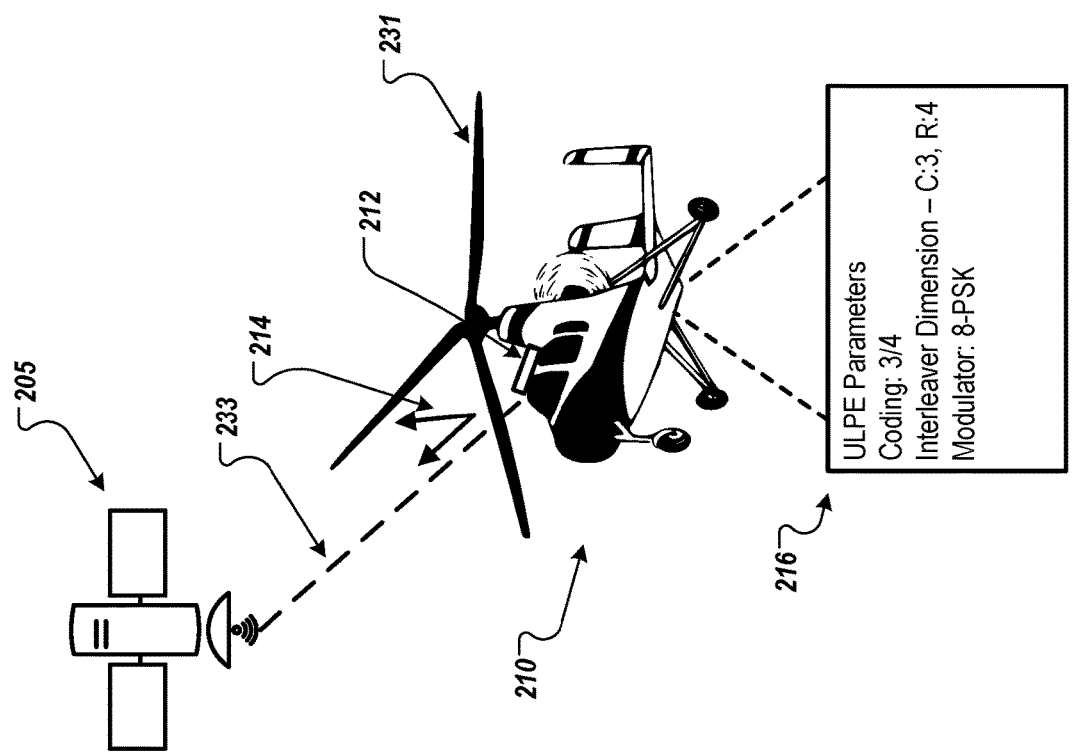

FIG. 2A is a diagram that illustrates example components for transmission and reception of data in spite of periodic blockages. In particular, FIG. 2A illustrates a line of communication 233 between a satellite 205 and a terminal 212 of the helicopter 210 and communication parameters 216 for transmitting code blocks between the satellite 205 and the terminal 212 of the helicopter 210. The satellite 205 and the terminal 212 can communicate with each other along the line of communication 233, which may be periodically intersected by the blades 231 of the helicopter 210 at a particular incident angle 214. In this particular example, the communication parameters 216 can include ULPE parameters, including a ULPE code rate of 3/4, e.g., three rows of data and one row of parity data, an interleaver dimension of three columns and four rows, and a modulation scheme of 8-PSK. In the example, the terminal 212 in the helicopter 210 determines that the number of corrupted blocks per frame (e.g., E=2) is less than the number of parity blocks per frame (e.g., D=3). As a result the terminal 212 determines that more aggressive coding or modulation is appropriate, to increase throughput while remaining within a level of errors that can be corrected. The terminal 212 communicates with the satellite 205 and gateway to coordinate usage of the higher-throughput communication parameters.

There are many ways that a terminal or gateway can select higher-throughput or lower-throughput parameters as needed. For example, the terminal 212 can store a table that lists different coding options, e.g., coding schemes that respectively provide code rates of 1/2, 2/3, 3/4, 4/5, 7/8, and so on. In some implementations, the different code rates can be implemented with different interleaver dimensions, e.g., different ratios of data code blocks to parity code blocks. Other types of coding may alternatively be used. The coding options can be ordered in the table for incremental differences. For example, for a given entry in the table, the previous entry can represent a coding option with an incrementally lower code rate, and the following entry can represent a coding option with an incrementally higher code rate. Similarly, the code rates or other efficiency measures can be provided for different coding options. As a result, when the terminal 212 determines that a higher code rate is appropriate, the terminal 212 can look up and use the coding scheme in the next entry in the table (e.g., if entry 3 were being used, then the coding scheme in entry 4 can be selected). Similarly, when the terminal 212 determines that a lower code rate is appropriate, the terminal 212 can look up and use the coding scheme in the previous entry in the table (e.g., if entry 3 were being used, then the coding scheme in entry 2 can be selected). When the first or last entry of the table (e.g., the lowest or highest code rate option) is being used and a change in robustness or efficiency is still needed, then the system can change modulation instead.

The terminal 212 can also store a table of the different modulation options that are available, and can change through them in a similar manner. When the terminal 212 determines that a higher-order modulation is appropriate (e.g., more bits per symbol), the terminal 212 can use the table of modulations to look up the modulation in the subsequent entry in the table (e.g., if entry 4 were being used, then the modulation in entry 5 can be selected). This change in modulation can be accompanied by a change in code rate, for example, to couple an increase in modulation with a decrease in code rate, which may then be progressively incremented over future cycles if conditions remain favorable. When the terminal 212 determines that a lower-order modulation is appropriate (e.g., fewer bits per symbol), the terminal 212 can use the table of modulations to look up the modulation in the previous entry in the table (e.g., if entry 4 were being used, then the modulation in entry 3 can be selected). This change in modulation can be accompanied by a change in code rate, for example, to couple a decrease in modulation with an increase in code rate to more smoothly transition the throughput, rather than using the decreased order of modulation with the lowest code rate, which may be too conservative for the conditions present.

As shown in FIG. 2B, the terminal 212 of the helicopter 210 has coordinated a change in communication parameters to improve throughput. Based on the analysis of the rate of corrupted blocks, the communication parameters 216 change to communication parameters 217 with a different coding scheme. The modulation scheme remains the same. Instead of using a 3/4 code rate for ULPE blocks, however, the system adjusts the coding to use a 7/8 code rate. In the 7/8 code rate, which is higher than the 3/4 code rate, seven rows of data are included with one row of parity bits, and the interleaver dimensions change to include more rows, e.g., eight rather than four. Other adjustments can be made according to the process shown in FIG. 1B.

FIGS. 3A-3D show examples of Gray coding for various symbol constellations, each representing example of a modulation scheme that can be used in satellite communications discussed herein. The system can adaptively change between these different modulations using the techniques discussed above.

Figure 3B:
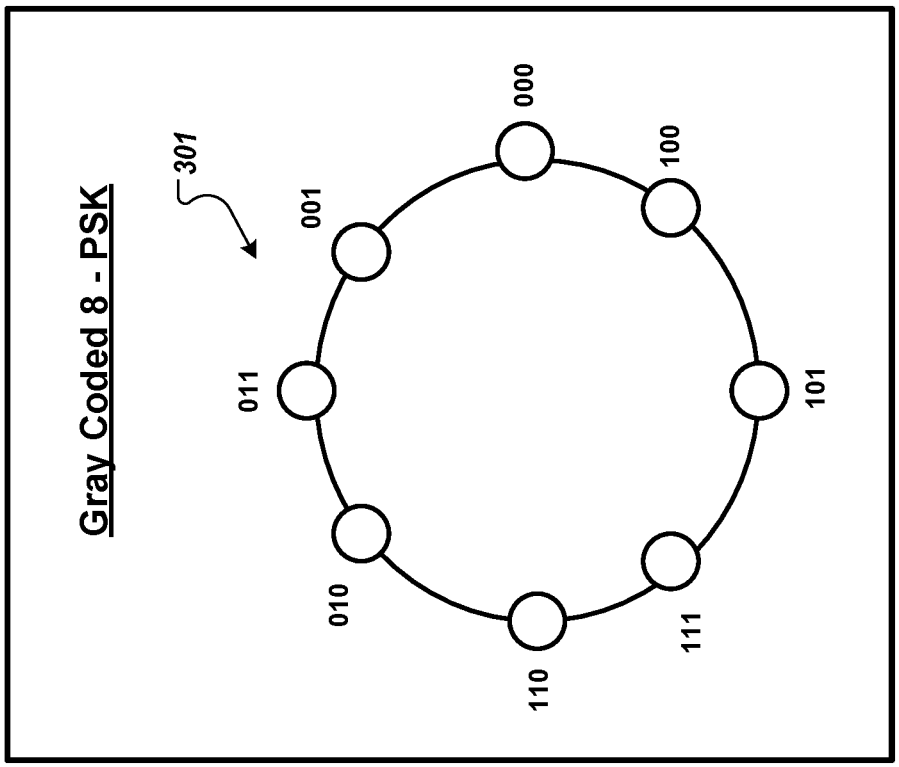
FIGS. 3A-3D are diagrams that illustrate example Gray coding for various modulation schemes.
Figure 3A:
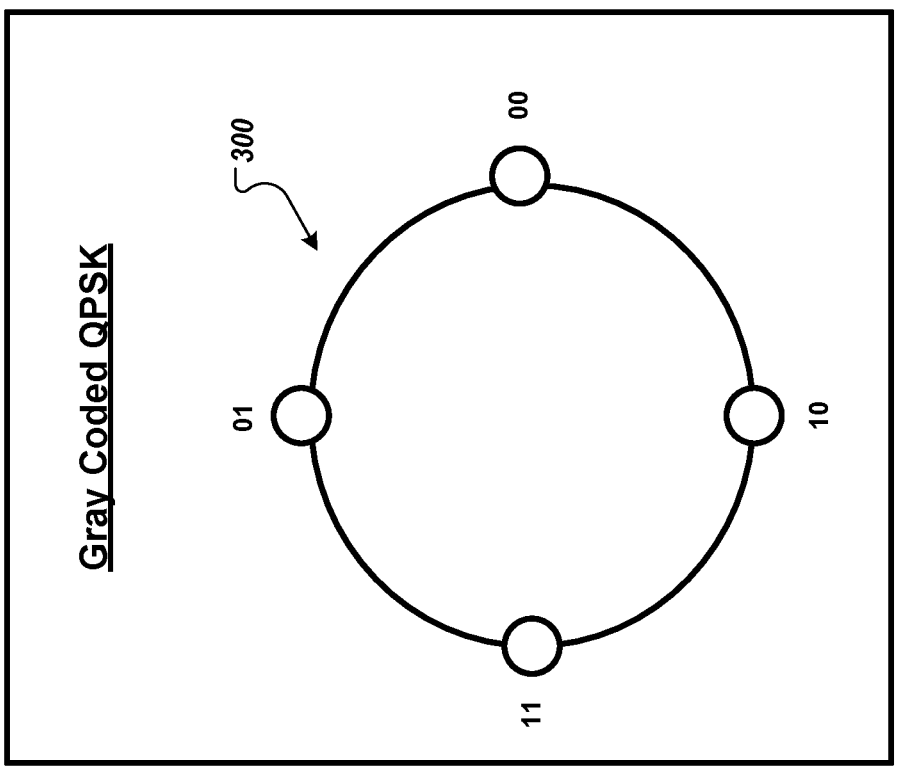

In general, the probability of demodulating a symbol to an incorrect neighboring symbol increases as signal to noise ratio (S/N) decreases. Gray coding helps to limit the impact of a symbol error to a single bit error. For bit-oriented inner codes such as LDPC, this benefit is particularly helpful. Due to the fluctuation of SNR in a mobile environment, a link margin of 2-3 dB is typically employed to provide a margin to limit effects of instantaneous multipath fading. FIGS. 3A and 3B show Gray-coded constellations for QPSK and 8-PSK, respectively, which are both modulations with constant amplitude at the sampling point, and so they are not sensitive to amplitude fades.

FIG. 3A shows a symbol constellation 300 that illustrates an example Gray coding for a QPSK modulation scheme. QPSK provides two bits of information per symbol, and a shown the symbols include "00," "10," "11," and "01". With an error correction-coding scheme as discussed above, the Gray-coded QPSK may be appropriate for use when SNR is, for example, below 5 or 6 dB.

FIG. 3B illustrates a symbol constellation 301 that illustrates an example Gray coding for an 8-PSK modulation scheme. 8-PSK provides three bits of information per symbol. For example, the 8 symbols can be arranged in an order "000," "100," "101," "111," "110," "010," "011," and "001". As an example, Gray-coded 8-PSK may be appropriate for use when, for example, SNR is between about 5-9 dB.

In some cases, when the received SNR is above 8 dB, the receiver can increase the modulation scheme to 16-ary modulation (e.g., 16 total symbols, with four bits per symbol) or higher.

Figure 3D:
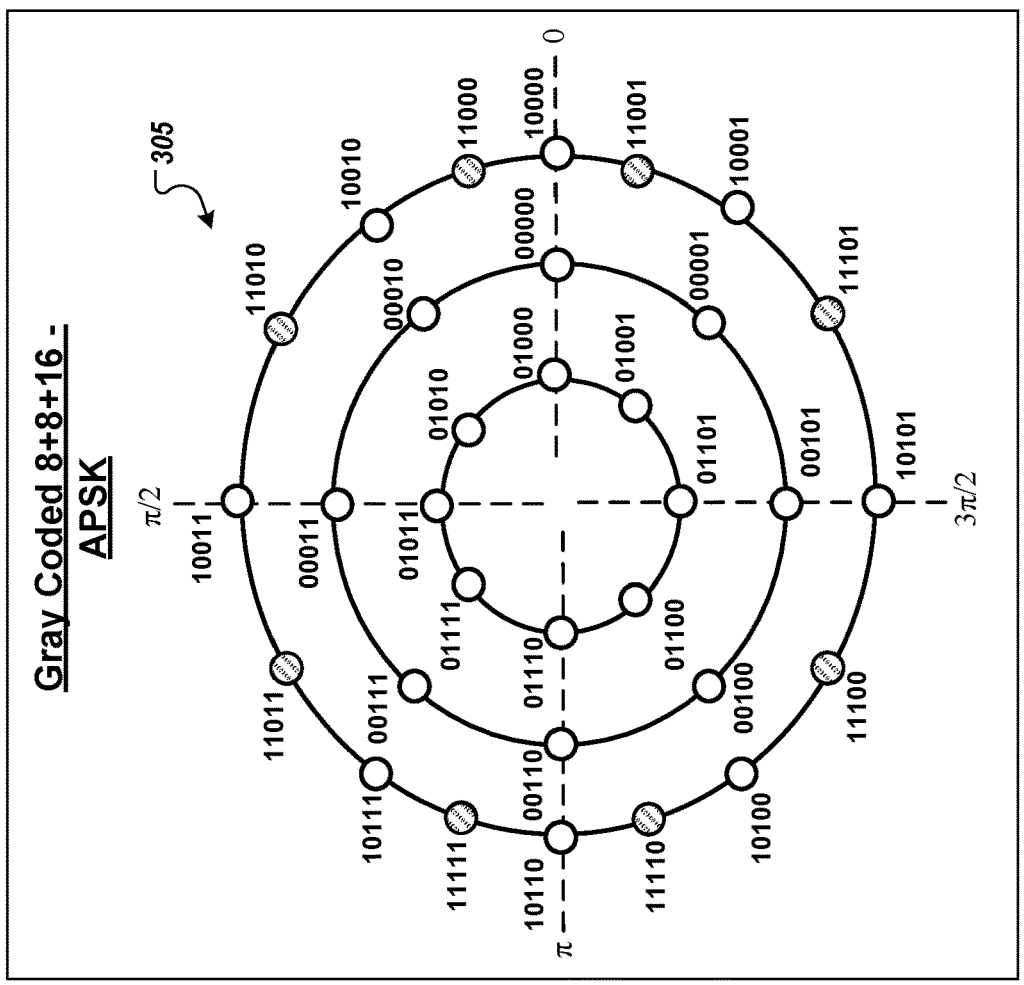
Figure 3C:
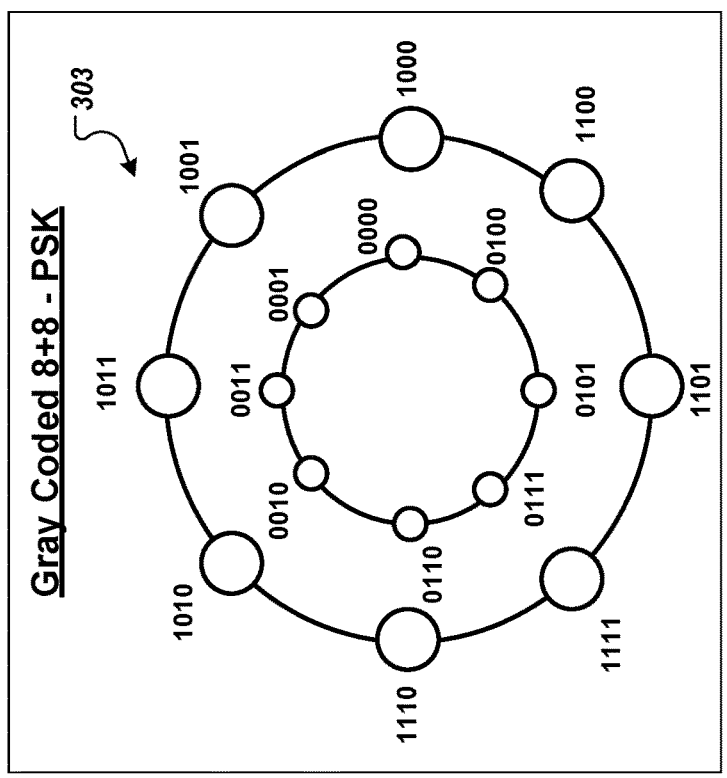

FIG. 3C illustrates a symbol constellation 303 with Gray coding for an 8+8-PSK modulation scheme providing four bits per symbol. In many cases, 16-ary modulation, such as 16-QAM or 4+12-APSK, is more sensitive to amplitude fades than 8-ary modulation. In many cases, automatic gain control (AGC) cannot adjust sufficiently fast to track errors. 8+8-APSK can offer improved performance in the additive white Gaussian noise (AWGN) channel than 4+12-APSK when the SNR is below about 10 dB. However, Gray-coded 8+8-APSK scheme is even more robust to amplitude fades than typical 4+12-APSK, because the difference between demodulated symbols between the outer and inner ring is only 1 bit. At the onset of a blockage period, the transmitted symbols can be most likely corrupted by reduced signal strength due to fading, while the corruption in signal phase is a much weaker secondary effect. For a two-ring signal constellation such as 8+8-APSK, it is more likely that the receiver will make an amplitude error rather than a phase error. Gray coding is an effective way to take advantage of this property. For example, the bit used to select between the two 8-symbol rings can be specified by amplitude, which can have the effect of isolating the most likely error from signal fade due to the periodic blockage to the bit corresponding to the ring selection.

Gray labeling typically results in better soft-decision input to forward error correction decoder on bit probabilities. Additionally, the bit mapping of 8+8-APSK can be constructed from a Gray coded 8-PSK, by adding an extra bit (e.g., the value at the far left in the example) that differentiates the inner and outer rings. For example, the outer ring shows a "1" as the far left of each label, while the inner ring shows a "0" at the far left of each label. The 8 symbols of the inner ring can include, in order around the ring, "0000," "0100," "0101," "0111," "0110," "0010," "0011," and "0001". The 8 symbols of the outer ring can include, in order around the ring, "1000," "1100," "1101," "1111," "1110," "1010," "1011," and "1001".

FIG. 3D shows a symbol constellation 305 for a Gray-coded 8+8+16-APSK modulation scheme, providing five bits per symbol. The technique discussed above for 16-ary modulation can be extended to 32-ary modulation with 8+8+8+8-APSK (4×8 APSK), for which two bits out of five bits of a symbol is selected by signal amplitude, or 16+16 APSK (2×16 APSK), for which one bit out of five bits of a symbol is selected by the amplitude. The 8+8+8+8 APSK and 16+16 APSK constellations can be Gray coded perfectly. 8+8+8+8 APSK can work well for highly linear channels, while the 16+16 APSK may work better for highly nonlinear channels. In practice, 32-ary modulation has shown good performance for SNR values in the range of about 10 to 11.5 dB range.

Unlike other 32-APSK modulations, the 8+8+16-APSK is a variation of 32-APSK that is specially optimized for channels with amplitude fade in moderate channel nonlinearity. At higher SNR, 8+8+16-APSK can offer some robustness against amplitude fading. For example, a particular bit is used to differentiate the outer ring (e.g., on which all symbols have the left-most value of "1") from the middle and inner rings (e.g., on which all symbols have the left-most value as "0"). The arrangement also provides Gray coding between the rings, so that for a given phase position that is a multiple of $\pi/4$, there is a difference of only one bit between the symbols of adjacent rings at that position. In the inner ring and the middle ring, values are Gray coded along the ring so that each symbol differs from adjacent symbols on the ring by only one bit. The symbols around the outer ring are not perfectly Gray coded, but can still be arranged so that the difference between adjacent symbols is no more than two bits (and in some cases is only one bit). The symbols of the outer ring can be aligned with symbols of the middle ring, so that the symbols with the same phase position are differentiated by the most significant bit (e.g., "1" for the left-most bit on the outer ring, and "0" for the left-most bit on symbols on the middle ring). Similarly, symbols of the middle ring can be aligned the adjacent constellation points of the inner ring so they differ only in the second-most significant bit (e.g., on the middle ring all symbols have "1" as the bit second from the left, and on the inner ring all symbols have "0" as the bit second from the left). The other 8 symbols of the outer ring (which are shaded and begin with "11") can be aligned with and share the same three-bit end portion as the symbols of the middle ring, but can be placed with and additional $\pi/8$ phase offset from the phase position of the corresponding symbol in the middle ring. For example, at phase position $\pi/4$, the values for the inner ring, middle ring, and outer ring are respectively "01010," "00010," and "10010" and so share the same three-bit end portion, while the initial two bits differ in a Gray code manner from one ring to the next. The other symbol that ends with the same "010" end portion is placed at a $\pi/8$ offset, so that the symbol "11010" is placed on the outer ring at phase position $3\pi/8$. This does not provide a perfect Gray coding along the outer ring, e.g., the difference between the symbols at $3\pi/8$ ("11010") and at $\pi/2$ ("10011") is two bits not one. Nonetheless, the 8+8+16 APSK arrangement can provide significant improvement in reception over conventional 32-APSK especially in the presence periodic blockages such as those caused by helicopter blades.

The arrangement shown in FIG. 3D has several significant properties, discussed in more detail below, that can help improve robustness of reception, especially in the presence of periodic blockages. The constellation 305 provides a multi-bit gray code sequence for changes in amplitude, shown in the example by the change in the first two bits when crossing from one ring to the next. The constellation 305 also shows a multi-bit gray code for changes in phase, shown in the example by the gray code sequence used to define the last three bits of each symbol. The same gray code sequence is used for each of the rings, although on the outer ring each three-bit value in the sequence is used twice (e.g., is repeated with an adjacent symbol at a $\pi/8$ offset). The constellation 305 makes use of different ring sizes (two rings of 8 symbols and one of 16 symbols).

To define the values of the symbols, starting with the inner-most ring, the three least-significant bits (or three right-most bits) of each symbol in the inner-most ring can be labeled with a Gray code sequence, such as 000, 010, 011, 111, 110, 100, 101, and 101, e.g., starting at the zero phase position (e.g., "01000" on the inner ring) and moving counterclockwise. Thus, each symbol on the inner ring differs from the previous symbol by only 1 bit, and no symbol is repeated. Next, the middle ring includes eight symbols, each symbol includes the same least three significant bits or three right-most bits as the most inner ring that is in the same phase position. For the outer ring, the symbols that are aligned at the same phase positions as those of the middle ring include the same least three significant bits or three right-most bits. Then, a two-bit prefix is applied to each symbol on each ring. The inner ring's two-bit prefix is "01," the middle ring's two-bit prefix is "00," and the outer ring's two-bit prefix is "10." These prefixes are Gray coded so that each ring's prefix differs by one bit from the prefix of any adjacent ring. In the outer-most ring, the other symbols that are not aligned in phase with the symbols of the middle ring (e.g., the shaded constellation points) are assigned a prefix of "11." In these symbols on the outer ring, the three least significant bits are the same as the next symbol on the outer ring, moving counter-clockwise along the outer ring. For example, symbol "11011" at phase 5π/8 in the outer ring has a final three bits that match those of the symbol "10011" on the outer ring at phase position π/2. However, the presence of 8 shaded symbols in the outer-ring that are not in phase with the middle ring's symbols (e.g., not aligned at phase positions that are multiples of π/4) mean that the symbols along the outer ring are not perfectly Gray coded. Consequently, an error with one of these 8 symbols can potentially cause a two-bit error: a one bit error in the prefix and another bit error in the least significant bit.

In further detail, the 8+8+16-APSK modulation scheme provides five bits of information per symbol. For example, the 8 symbols of innermost ring of the diagram 305 can include, in sequence counterclockwise, "01000," "01001," "01101," "01100," "01110," "01111," "01011," and "01010." The 8 symbols of the middle ring of the diagram 305 can include, in sequence counterclockwise, "00000," "00001," "00101," "00100," "00110," "00111," "01011," and "00010". The 16 symbols of the outer-most ring of the diagram 305 can include, in sequence counterclockwise, "10000," "11001," "10001," "11101," "10101," "11100," "10100," "11110," "10110," "11111," "10111," "11011," "10011," "11010," "10010," and "11000".

The symbol constellation 305 can be generated in the following manner or with the following properties. Each of the 32 five-bit symbols is formed of a first portion, a two-bit prefix, and a second portion, a three-bit value. The two-bit prefix is set based on the ring in which the symbol is located. The three-bit value is based on a Gray code sequence and the value from the Gray code sequence depends on the phase position around the ring. This technique allows for Gray coding across multiple dimensions or transmission characteristics. For example, there is Gray coding for phase so that, at least for the inner ring and middle ring, adjacent symbols in the ring differ by only one bit. In addition, there is Gray coding for amplitude (e.g., across rings) so that symbols that have the same phase and are adjacent in amplitude differ by only one bit. As discussed below, there are some symbols in the outer ring that do not follow this relationship (shown in shaded circles). Instead, the shaded symbols have phase positions that are not multiples of π/4 and so do not align with the phase positions of any symbols in the inner and middle rings. The shaded symbols are not perfectly Gray coded with respect to the adjacent symbols in the outer ring, but the values are assigned so that each of the symbols in the outer ring differs from the adjacent symbols around the outer ring by no more than two bits.

In the example constellation 305, the same Gray-code sequence is used for each of the three rings, e.g., 000, 010, 011, 111, 110, 100, 101, and 101. The values are aligned with phase positions so that the same three-bit value is used at the same phase position across each of the rings, at least for phase positions that are multiples of π/4 and so are common to all three rings. For example, for each of the three rings, the symbol at a phase of zero has the three-bit end portion of "000" (e.g., from symbols "01000, "00000," and "10000"). Similarly, at the π/4 position, each symbol has the same three-bit end portion of "010" (e.g., from symbols "01010," "00010," and "10010"). This relationship holds for the other phase positions that are multiples of π/4. The alignment of the values in this manner helps minimize the effect of amplitude variation on the error rate. For example, when a symbol is from one of the phase positions that is a multiple of π/4 (e.g., symbols shown as circles without shading), noise or interference that affects amplitude (and so may place a received symbol on the wrong ring) does not affect the three-bit end portion, since the three-bit end portion will be the same regardless of which amplitude level (e.g., which ring) the receiver selects.

The initial two-bit prefixes also help increase the likelihood of successful reception. Symbols on the inner ring share the same two-bit prefix, and symbols on the middle ring also share a same two-bit prefix. For example, all of the symbols on the inner ring begin with the two-bit prefix "01," and all of the symbols on the middle ring begin with the two-bit prefix "00." This provides strong robustness for the initial two bits for variation in phase. The symbols for the outer ring each have one of two different prefixes, "10" and "11." Moving around the outer ring, the symbols alternate between starting with the "01" prefix and the "11" prefix. The symbols beginning with the "10" prefix are aligned with the phase positions that are multiples of π/8, the same phase positions where the symbols for the inner ring and middle ring are located. This results in 24 of the 32 symbols being aligned with Gray coding both for changes in amplitude (e.g., switching from one ring to the next) and for changes in phase (e.g., moving around a ring). In other words, for each of the π/4 phase positions, the same three-bit end portion is used across all three rings, while the two-bit prefixes differ by only one bit. If there is amplitude variation that results in reception on the wrong ring, the Gray coding among the two-bit prefixes (e.g., "01" to "00" from inner ring to middle ring, and "00" to "10" for the outer ring) generally limits the error to one bit, which the system can correct using the upper layer protocol and LDPC coding.

On the outer ring, the shaded symbols represent symbols at phase positions that are not multiples of π/4, e.g., phase positions of π/8, 3π/8, 5π/8, 7π/8, 9π/8, 11π/8, 13π/8, and 15π/8. Each of the shaded symbols has a prefix of "11" and on either side the adjacent symbol on the outer ring has a prefix of "10." As a result, the potential error between the prefix portions of adjacent symbols in the outer ring is limited to only one bit. The values of the three-bit end portion are also set to minimize the potential error if confused with an adjacent symbol. For each of the shaded symbols, one of the adjacent symbols in the ring shares the same three-bit end portion. For example, for position π/8 (e.g., symbol "11000"), the three-bit end portion of "000" is the same as the three-bit end portion of the adjacent symbol at a phase position of zero (e.g., symbol "10000"). Thus, there is only a one-bit overall difference between the five bits of each shaded symbol and the adjacent symbol around the ring in a clockwise direction. In the opposite direction around the outer ring (e.g., counterclockwise), the three-bit end portion for a symbol differs by only one bit from the adjacent symbol. For example, for the position π/8 (e.g., symbol "11000"), the three-bit end portion of "000" differs by only one bit from the three-bit end portion "010" of the adjacent symbol at a phase position of π/4 (e.g., symbol "10010"). Thus, the worst-case error when incorrectly receiving an adjacent symbol along the outer ring is two bits of error, a one-bit error in the two-bit prefix and another one-bit error in the three-bit end portion. The situation is improved because the arrangement of symbols can further help localize the bit error within the three-bit end portion. For example, even if the symbol at position π/8 is erroneously received as an adjacent symbol on the constellation, or even as a symbol two symbols in either direction, the middle bit in the sequence would still be correctly received as "0." As a result, a receiver can be designed to take into account these relationships and the likelihood of bit errors at different positions for different received symbols and under different conditions, to better manage and correct for errors that may occur.

The alignment of the symbols using a same Gray code sequence shared by the rings and further using another Gray code sequence between the rings provides a number of benefits. First, in both the inner ring and middle ring, phase error resulting in erroneous reception of an adjacent symbol on the correct ring results in only a single-bit error, which the upper layer protocol and LDPC coding can correct. In addition, the alignment of the rings by phase position helps limits amplitude error to a single bit error, at least for each of the π/4 phase positions where the last three bits are the same across all of the rings.

While the arrangement of constellation 305 does not provide a full gray coding in the outer ring, the advantage of providing five bits per symbol with only three amplitude levels (e.g., rings) can be significant. For example, adding a fourth ring may increase the complexity of reception, and may also further increase the sensitivity of reception to amplitude variation, which can be a significant issue due to periodic blockages such as those caused by helicopter blades. In situations where the amplitude variation is not a significant concern, then an alternative would be to use four rings of eight symbols each, each ring sharing the same three-bit Gray coded sequence for the three-bit end portion, so that the same three-bit value is use at the same phase position for each of the rings. A true Gray code sequence can be for the two-bit prefixes across four different rings, e.g., "01," "00," "10," "11," so that the prefix for each ring differs by only one bit from the prefix for each adjacent ring.

While the constellation 305 divides the symbols into two sections, a two-bit prefix and a three-bit portion, this arrangement is not required. The bits that change based on phase or amplitude can be placed in other arrangements, may be interspersed together, etc.

Communication devices can be configured to transmit and receive data according to any or all of the symbol constellations shown in FIG. 3A-3D as well as others. Transmitters can be configured (e.g., programmed) to modulate a carrier using the symbol assignments using any of the various symbol constellations, and to switch between modulations using the techniques discussed above. Similarly, receivers can be configured (e.g., programmed) to receive and demodulate transmitted signals modulated based on these constellations. Receivers can be configured to switch between demodulating according to different modulation schemes as discussed above.

FIG. 4 is a table 400 that illustrates an example modulation selection based on received a signal to noise ratio (SNR). The table 400 illustrates the ranking of modulation schemes from lower order (and lower information density) at the left to higher order (and higher information density) to the right. In other words, QPSK is the lowest order modulation in this table, and 8+8+16-APSK is the highest order modulation.

The table 400 shows example SNR values, as well as values of SNR plus link margin, to represent the conditions in which these modulations are typically used included. The link margin in the example of FIG. 4 for "S/N with Margin" is 3 dB. Other link margins may be used. While the modulations are shown with SNR ranges for reference, the actual selection of a modulation by the system need not be based on, or at least not entirely on, the SNR measured. As discussed above, the decision whether to switch to a higher or lower order modulation can be based on the number of corrupted or not fully recoverable code blocks in a frame, and this analysis can be used to determine whether to change from the current modulation to a different modulation. In some implementations, the SNR of a terminal may be compared with SNR reference ranges as illustrated to determine an initial modulation to use. In some cases, reference SNR ranges may provide a boundary or threshold that limits a terminal to using certain modulations only when certain SNR conditions are present. Nevertheless, in other implementations, the terminal can adjust the modulation independent of the current SNR calculated the terminal, instead making incremental adjustments to modulation based on the amount of code blocks that are corrupted or unrecoverable per frame. This can help ensure that the terminal obtains the maximum throughput available, adaptively shifting modulation to a higher or lower order as conditions change, even if this has the consequence of eliminating the link margin typically present and operates at or near the minimum threshold SNR needed for reception.

A receiver in the helicopter, for example, can store data that lists the different modulations available and the relationships between them, e.g., a ranking or ordering of the modulations according to their relative robustness to low SNR or amplitude fading. For example, the receiver can refer to the table 400 or a similar table when determining whether a higher or lower-order modulation is available. When the receiver performs the process illustrated in FIG. 1B, the receiver compares the number of corrupted blocks per frame with the number of parity blocks per frame. Based on this comparison, the receiver can decide to increase an order of the modulation scheme (e.g., from 8-PSK to 8+8-APSK) if the number of error blocks is less than the number of designated parity blocks, or to decrease an order of the modulation scheme (e.g., from 8-PSK to QPSK) if the number of error blocks is greater than the number of designated parity blocks.

When signal strength is high, higher throughput can be achieved by using higher-order modulation with appropriate FEC code rate, while maintaining a reasonable link margin (e.g. 3 dB) as shown by table 400. In some implementations, the selection of a modulation can be based on the measured SNR (in some cases, as the SNR excluding the impact of helicopter blade blockages). A change in modulation may also change the value of N discussed with respect to FIG. 1B. The value N represents the amount of time needed to send one frame, and increasing to a higher-order of modulation means it would take less time to send each code block (e.g., given the same data length per code block, the duration needed to transmit the code block may change as modulation varies). With appropriate modulation switching, throughput can increases with higher SNR at a rate of roughly 8% increased throughput per dB of increased SNR. In many cases, it may be beneficial to reduce the link margin that is maintained in the system and instead use a higher-throughput modulation and coding combination that is uses spectrum resources (e.g., time on a given frequency channel) more efficiently.

In some implementations, the algorithm for modulation selection can start with a conservative link margin, such as 3 dB, and can set the initial modulation and coding that matches the calculated SNR of the terminal. For example, if the terminal has an SNR of 10 dB, the terminal can look up in the table 400 which modulation is mapped to the "SNR with Margin" range that includes this value. In this example, the identified modulation would be 8-PSK, since the measured value of 10 dB is determined to be in the range of 8-12 dB assigned to 8-PSK in the table 400. The terminal can also determine the number of parity blocks needed to cover an entire blockage period taking account for the asynchronous relationship between blade rotation and parity code block boundaries. The terminal can use this information to set or adjust the frame structure and interleaver size.

As illustrated in table 400, the receiver determines that the SNR is less than or equal to 5 dB, then receiver can determine that modulation of QPSK should be used by the transmitter. If the receiver determines that the SNR is between 5 to 9 dB, then receiver can determine that the transmitter should use 8-PSK. If the receiver determines that the SNR is between 9 to 10 dB, then receiver can determine that the transmitter should use a modulation of 8+8-APSK. If the receiver determines that the SNR is greater than 10 dB, then receiver can determine that the transmitter should use a modulation of 8+8+16-APSK.

With a link margin of 3 dB factored in (e.g., the "SNR with Margin"), the receiver can make similar determinations about which modulation scheme to use. For example, the receiver determines that the SNR is less than or equal to 8 dB, then receiver can determine that modulation of QPSK should be used by the transmitter. If the receiver determines that the SNR is between 8 to 12 dB, then receiver can determine that the transmitter should use 8-PSK. If the receiver determines that the SNR is between 12 to 13 dB, then receiver can determine that the transmitter should use a modulation of 8+8-APSK. If the receiver determines that the SNR is greater than 13 dB, then receiver can determine that the transmitter should use a modulation of 8+8+16-APSK.

Once reliable reception is established is established using the initially-selected modulation and coding, the receiver can determine if the link margin is excessive by counting the number of corrupted or erased code blocks, E, in a period, N, that is the duration of one frame. If the maximum number of corrupted or erased code blocks (e.g., maximum value of E over multiple frames, such as over a second or other time period) is at least one less than the designed erasure correction capability in the frame structure (e.g., if E<D, the number of parity blocks), then the receiver can request to move to a higher inner code rate, e.g., code rate for coding within an individual code block. Conversely, if E>D, the receiver can request to move to a lower inner code rate. From this point, as the connection continues, the settings for modulations and codings can be adjusted incrementally, and the modulation used and code rate used may diverge from those indicated in the table 400. Using the value if E, however, the receiver, and the system as a whole, can maintain the level of errors to the level that is typically correctable by the receiver using the inner code block FEC coding and the UPLE parity blocks.

As the receiver continues to receive transmissions, the receiver detects inner code block errors (e.g., errors in the data within a data code block) and the receiver corrects the errors using error correction techniques such as a cyclic redundancy check (CRC) of the decoded information or using the parity check equations of the inner code. After moving to the higher code rate, if the number of corrupted or erased code blocks at some point exceeds the designed value (e.g., if E>D), the terminal can request to move back to the previous inner code rate. This signals that the maximum throughput capability available under current conditions has been achieved. Otherwise, while the number of corrupted or erased code blocks is less than the number of parity code blocks (e.g., if E<D), the receiver can progressively move to even higher code rates.

When the terminal detects that it becomes more efficient to use a higher-order modulation of lower code rate to achieve throughput, a similar iterative procedure can be used to request a higher-order modulation, using a value of N (e.g., frame transmission duration) appropriate for the higher-order modulation and a new code rate. In the analysis, some hysteresis may be introduced to ensure the changes are relatively stable, e.g., performed without too frequently switching between code rates and/or modulations. As another example, the system may look at frames in a certain window (e.g., the previous 20 frames, or all frames in the previous 1 second of reception).

In further detail, for example, the decision whether to alter coding or modulation can limited to be made at certain intervals, such as once per second, once every 5 seconds, once every 15 seconds, etc. Changes that decrease code rate or decrease the order of modulation may be permitted more frequently or without restriction in timing or frequency, to enable poor conditions to be addressed quickly. In addition, when the analysis is performed, the system can look at multiple previous frames rather than a single one. For example, the system may be compare E and D for each of the preceding 10 frames, 50 frames, 100 frames, etc., or may compare E and D for all frames in the preceding 1 second, 5 seconds, etc.

The system may require that at least a minimum threshold of the frames in the analyzed group of frames have the same comparison result in order to justify making a change that increases code rate or modulation density. For example, a threshold of 70% may be set for changes that increase throughput and require higher SNR, and the analyzed group can be the last 10 frames. If in a group there are 5 frames have the condition E=D and five frames have the condition that E<D, then the terminal would not change the modulation and coding because the threshold was not met. On the other hand, if 8 out of 10 previous frames showed E<D, then the threshold would be met and the terminal would increase code rate or adjust modulation to improve throughput. Other thresholds can be used, for example, a strict threshold of 100% may be required to improve throughput in some cases. As another example, a threshold can be set for taking actions that decrease throughput and decrease the required SNR (e.g., lower code rate, shift to a lower-order modulation). The threshold may be the same as the threshold for increasing throughput, or may be different, such as being much lower, e.g., 30%. Thus, if at least 3 of the last 10 frames show that E>D, then the terminal can make a change to reduce code rate, and thus increase reliability of the connection.

FIG. 5 is a flow diagram that illustrates an example of a process 500 for improving communication in a satellite environment despite a periodic blockage in a communication link. A receiver can receive, from a transmitter, code blocks transmitted on a communication channel according to a first set of communication parameters that comprises one or more of a first modulation used to transmit the code blocks or a first coding used to encode information in the code blocks for transmission (502). The receiver can determine a number of corrupted code blocks in a series of the code blocks received (504). The receiver can determine a number of parity blocks in the series of code blocks (506). The receiver can compare the number of corrupted code blocks in the series of code blocks with the number of parity blocks in the series of code blocks (508). The receiver can determine a second set of communication parameters for communication between the transmitter and the receiver based on the comparison of the number of corrupted code blocks in the series of code blocks with the number of parity blocks in the series of code blocks (510). The receiver can communicate the second set of communication parameters to the transmitter for subsequent transmissions by the transmitter to the receiver (512).

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms machine-readable medium and computer-readable medium refer to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term machine-readable signal refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network (LAN), a wide area network (WAN), and the Internet.

The computing system can include clients and servers. A client and server are generally remote from each other and typically interact through a communication network. The relationship of client and server arises by virtue of computer programs running on the respective computers and having a client-server relationship to each other.

Although a few implementations have been described in detail above, other modifications are possible. For example, while a client application is described as accessing the delegate(s), in other implementations the delegate(s) may be employed by other applications implemented by one or more processors, such as an application executing on one or more servers. In addition, the logic flows depicted in the figures do not require the particular order shown, or sequential order, to achieve desirable results. In addition, other actions may be provided, or actions may be eliminated, from the described flows, and other components may be added to, or removed from, the described systems. Accordingly, other implementations are within the scope of the following claims.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A method comprising:
   receiving, by a receiver and from a transmitter, code blocks transmitted on a communication channel according to a first set of communication parameters that comprises one or more of a first modulation used to transmit the code blocks or a first coding used to encode information in the code blocks for transmission;

determining, by the receiver, a number of corrupted code blocks in a series of the code blocks received by the receiver;

determining, by the receiver, a number of parity blocks in the series of code blocks;

comparing, by the receiver, the number of corrupted code blocks in the series of code blocks with the number of parity blocks in the series of code blocks;

selecting, by the receiver, a second set of communication parameters for communication between the transmitter and the receiver, wherein the second set of communication parameters is selected from a set of modulations and/or codings, and wherein the second set of communication parameters is selected based on a result of comparing of the number of corrupted code blocks in the series of code blocks with the number of parity blocks in the series of code blocks; and communicating, by the receiver and to the transmitter, the second set of communication parameters for subsequent transmissions by the transmitter to the receiver.

2. The method of claim 1, wherein the code blocks are encoded using low-density-parity-check (LPDC) coding; and wherein the second set of communication parameters includes a second modulation that is different from the first modulation, wherein the first modulation and the second modulation are each one of QPSK, 8-PSK, 8+8 APSK, or 8+8+16 APSK.

3. The method of claim 1, further comprising:

determining, by the receiver and based on the determined number of corrupted code blocks, characteristics of a periodic blockage of the communication channel between the transmitter and the receiver, the characteristics comprising (i) a blockage duration indicative of a duration of the blockage and (ii) a blockage interval indicative of a period of time from a beginning of a blockage event to a beginning of a next blockage event, wherein the second set of communication parameters is selected based on the determined characteristics of the periodic blockage of the communication channel between the transmitter and the receiver.

4. The method of claim 3, wherein:

the transmitter is a transmitter of a satellite, and wherein the receiver is mounted on a helicopter that is in flight, and the receiver is oriented to communicate with the transmitter along a path such that the periodic blockage is caused by rotation of rotor of the helicopter periodically blocking the path between the receiver and the transmitter.

5. The method of claim 1, wherein selecting the second set of communication parameters comprises:

determining, by the receiver and based on the comparison, that the number of corrupted code blocks is less than the number of parity blocks; and in response to determining that the number of corrupted code blocks is less than the number of parity blocks, selecting, by the receiver, the second set of communication parameters to include a second coding that provides a higher code rate than the first coding.

6. The method of claim 5, wherein selecting the second set of communication parameters comprises:

determining, by the receiver and based on the comparison, that the number of corrupted code blocks is less than the number of parity blocks;

determining, by the receiver, that a set of codings available for communication between the transmitter and receiver does not include a coding with a code rate greater than a code rate of the first coding of the first communication parameters; and in response to determining (i) that the number of corrupted code blocks is less than the number of parity blocks and (ii) that the set of codings available for communication between the transmitter and receiver does not include a coding with a code rate greater than a code rate of the first coding of the first communication parameters, selecting, by the receiver, the second set of communication parameters to include a second modulation that provides higher throughput than the first modulation.

7. The method of claim 1, wherein selecting the second set of communication parameters for communication between the transmitter and the receiver further comprises:

determining, by the receiver, a channel quality measure that indicates a condition of the communication channel; and selecting, by the receiver, the second set of communication parameters based on the determined channel quality measure, wherein the receiver stores data that identifies different communication parameters and different values or ranges of channel quality measures that correspond to the different communication parameters, and wherein at least one communication parameter in the second set of communication parameters is selected based on determining that the determined channel quality measure corresponds to the value or range of channel quality measures that the stored data indicates as corresponding to the at least one communication parameter.

8. A system comprising:

one or more processors and one or more machine-readable storage devices storing instructions that are operable, when executed by the one or more processors, to cause the system to perform operations comprising:

receiving, by a receiver and from a transmitter, code blocks transmitted on a communication channel according to a first set of communication parameters that comprises one or more of a first modulation used to transmit the code blocks or a first coding used to encode information in the code blocks for transmission;

determining, by the receiver, a number of corrupted code blocks in a series of the code blocks received by the receiver;

determining, by the receiver, a number of parity blocks in the series of code blocks;

comparing, by the receiver, the number of corrupted code blocks in the series of code blocks with the number of parity blocks in the series of code blocks;

selecting, by the receiver, a second set of communication parameters for communication between the transmitter and the receiver, wherein the second set of communication parameters is selected from a set of modulations and/or codings, and wherein the second set of communication parameters is selected based on a result of comparing of the number of corrupted code blocks in the series of code blocks with the number of parity blocks in the series of code blocks; and communicating, by the receiver and to the transmitter, the second set of communication parameters for subsequent transmissions by the transmitter to the receiver.

9. The system of claim 8, wherein the code blocks are encoded using low-density-parity-check (LDPC) coding; and
wherein the second set of communication parameters includes a second modulation that is different from the first modulation, wherein the first modulation and the second modulation are each one of QPSK, 8-PSK, 8+8 APSK, or 8+8+16 APSK.

10. The system of claim 8, further comprising:
determining, by the receiver and based on the determined number of corrupted code blocks, characteristics of a periodic blockage of the communication channel between the transmitter and the receiver, the characteristics comprising (i) a blockage duration indicative of a duration of the blockage and (ii) a blockage interval indicative of a period of time from a beginning of a blockage event to a beginning of a next blockage event,
wherein the second set of communication parameters is selected based on the determined characteristics of the periodic blockage of the communication channel between the transmitter and the receiver.

11. The system of claim 10, wherein:
the transmitter is a transmitter of a satellite, and wherein the receiver is mounted on a helicopter that is in flight, and the receiver is oriented to communicate with the transmitter along a path that is periodically blocked by a rotating rotor of the helicopter.

12. The system of claim 8, wherein selecting the second set of communication parameters comprises:
determining, by the receiver and based on the comparison, that the number of corrupted code blocks is less than the number of parity blocks; and
in response to determining that the number of corrupted code blocks is less than the number of parity blocks, selecting, by the receiver, the second set of communication parameters to include a second coding that provides a higher code rate than the first coding.

13. The system of claim 12, wherein selecting the second set of communication parameters comprises:
determining, by the receiver and based on the comparison, that the number of corrupted code blocks is less than the number of parity blocks;
determining, by the receiver, that a set of codings available for communication between the transmitter and receiver does not include a coding with a code rate greater than a code rate of the first coding of the first communication parameters; and
in response to determining (i) that the number of corrupted code blocks is less than the number of parity blocks and (ii) that the set of codings available for communication between the transmitter and receiver does not include a coding with a code rate greater than a code rate of the first coding of the first communication parameters, selecting, by the receiver, the second set of communication parameters to include a second modulation that provides higher throughput than the first modulation.

14. The system of claim 8, wherein selecting the second set of communication parameters for communication between the transmitter and the receiver further comprises:
determining, by the receiver, a channel quality measure that indicates a condition of the communication channel; and
selecting, by the receiver, the second set of communication parameters based on the determined channel quality measure, wherein the receiver stores data that identifies different communication parameters and different values or ranges of channel quality measures that correspond to the different communication parameters, and wherein at least one communication parameter in the second set of communication parameters is selected based on determining that the determined channel quality measure corresponds to the value or range of channel quality measures that the stored data indicates as corresponding to the at least one communication parameter.

15. One or more non-transitory machine-readable media storing instructions that are operable, when executed by one or more processors, to cause the one or more processors to perform operations comprising:
receiving, by a receiver and from a transmitter, code blocks transmitted on a communication channel according to a first set of communication parameters that comprises one or more of a first modulation used to transmit the code blocks or a first coding used to encode information in the code blocks for transmission;
determining, by the receiver, a number of corrupted code blocks in a series of the code blocks received by the receiver;
determining, by the receiver, a number of parity blocks in the series of code blocks;
comparing, by the receiver, the number of corrupted code blocks in the series of code blocks with the number of parity blocks in the series of code blocks;
selecting, by the receiver, a second set of communication parameters for communication between the transmitter and the receiver, wherein the second set of communication parameters is selected from a set of modulations and/or encodings, and wherein the second set of communication parameters is based on a result of the comparison of the number of corrupted code blocks in the series of code blocks with the number of parity blocks in the series of code blocks; and
communicating, by the receiver and to the transmitter, the second set of communication parameters for subsequent transmissions by the transmitter to the receiver.

16. The one or more non-transitory machine-readable media of claim 15, wherein the code blocks are encoded using low-density-parity-check (LDPC) coding; and
wherein the second set of communication parameters includes a second modulation that is different from the first modulation, wherein the first modulation and the second modulation are each one of QPSK, 8-PSK, 8+8 APSK, or 8+8+16 APSK.

17. The one or more non-transitory machine-readable media of claim 15, further comprising:
determining, by the receiver and based on the determined number of corrupted code blocks, characteristics of a periodic blockage of the communication channel between the transmitter and the receiver, the characteristics comprising (i) a blockage duration indicative of a duration of the blockage and (ii) a blockage interval indicative of a period of time from a beginning of a blockage event to a beginning of a next blockage event,
wherein the second set of communication parameters is selected based on the determined characteristics of the periodic blockage of the communication channel between the transmitter and the receiver.

18. The one or more non-transitory machine-readable media of claim 17, wherein:

the transmitter is a transmitter of a satellite, and wherein the receiver is mounted on a helicopter that is in flight, and the receiver is oriented to communicate with the transmitter along a path that is periodically blocked by a rotating rotor of the helicopter.

19. The one or more non-transitory machine-readable media of claim 15, wherein determining the second set of communication parameters comprises:

determining, by the receiver and based on the comparison, that the number of corrupted code blocks is less than the number of parity blocks; and in response to determining that the number of corrupted code blocks is less than the number of parity blocks, selecting, by the receiver, the second set of communication parameters to include a second coding that provides a higher code rate than the first coding.

20. The one or more non-transitory machine-readable media of claim 19, wherein selecting the second set of communication parameters comprises:

determining, by the receiver and based on the comparison, that the number of corrupted code blocks is less than the number of parity blocks;

determining, by the receiver, that a set of codings available for communication between the transmitter and receiver does not include a coding with a code rate greater than a code rate of the first coding of the first communication parameters; and in response to determining (i) that the number of corrupted code blocks is less than the number of parity blocks and (ii) that the set of codings available for communication between the transmitter and receiver does not include a coding with a code rate greater than a code rate of the first coding of the first communication parameters, selecting, by the receiver, the second set of communication parameters to include a second modulation that provides higher throughput than the first modulation.

\* \* \* \* \*

UNITED STATES PATENT AND TRADEMARK OFFICE
CERTIFICATE OF CORRECTION

| | | |
|---|---|---|
| PATENT NO. | : 11,838,127 B2 | |
| APPLICATION NO. | : 17/693188 | |
| DATED | : December 5, 2023 | |
| INVENTOR(S) | : Lin-nan Lee, Mustafa Eroz and Rohit Iyer Seshadri | |

It is certified that error appears in the above-identified patent and that said Letters Patent is hereby corrected as shown below:

In the Claims

In Column 37, Line 25, In Claim 2, delete "(LPDC)" and insert -- (LDPC) --.

Signed and Sealed this
Thirteenth Day of February, 2024

Katherine Kelly Vidal
*Director of the United States Patent and Trademark Office*